US006885435B2

(12) United States Patent
Galburt

(10) Patent No.: US 6,885,435 B2
(45) Date of Patent: Apr. 26, 2005

(54) METHOD, SYSTEM, AND APPARATUS FOR MANAGEMENT OF REACTION LOADS IN A LITHOGRAPHY SYSTEM

(75) Inventor: Daniel N. Galburt, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 10/842,513

(22) Filed: May 11, 2004

(65) Prior Publication Data

US 2004/0207830 A1 Oct. 21, 2004

Related U.S. Application Data

(63) Continuation of application No. 10/095,070, filed on Mar. 12, 2002, now Pat. No. 6,784,978.

(51) Int. Cl.[7] .................. G03B 27/58; G03B 27/42; G03B 27/62
(52) U.S. Cl. .............. 355/72; 355/53; 355/75
(58) Field of Search ............... 355/53, 72–76; 310/10, 12; 378/34, 35; 318/575, 625

(56) References Cited

U.S. PATENT DOCUMENTS

| | | | |
|---|---|---|---|
| 4,952,858 A | 8/1990 | Galburt | |
| 5,285,142 A | 2/1994 | Galburt et al. | |
| 5,835,195 A | 11/1998 | Gibson et al. | |
| 5,864,389 A | 1/1999 | Osanai et al. | |
| 5,874,820 A | 2/1999 | Lee | |
| 5,909,272 A | 6/1999 | Osanai et al. | |
| 5,933,215 A | 8/1999 | Inoue et al. | |
| 5,939,852 A | 8/1999 | Akutsu et al. | |
| 6,036,162 A | 3/2000 | Hayashi | |
| 6,307,619 B1 | 10/2001 | Galburt et al. | |
| 6,327,024 B1 | 12/2001 | Hayashi et al. | |
| 6,329,780 B1 | 12/2001 | Ebihara et al. | |
| 6,493,062 B1 * | 12/2002 | Tokuda et al. | ................. 355/53 |
| 6,512,571 B1 | 1/2003 | Hara | |
| 6,538,720 B1 | 3/2003 | Galburt et al. | |
| 2001/0020684 A1 | 9/2001 | Hazelton | |

OTHER PUBLICATIONS

European Search Report for Application No. 03005312.8, mailed Sep. 9, 2003.

* cited by examiner

*Primary Examiner*—Henry Hung Nguyen
(74) *Attorney, Agent, or Firm*—Sterne, Kessler, Goldstein & Fox PLLC

(57) ABSTRACT

A method, system, and apparatus for management of reaction loads in a lithography system is described. An isolated structure is supported by a non-isolated structure. The isolated structure supports a moveable stage. A linear motor includes a first linear motor element and a second linear motor element. The first linear motor element is coupled to the moveable stage. A plurality of parallel flexure plates mount the second linear motor element on the isolated structure. A flexure rod is coupled between the non-isolated structure and the second linear motor element.

18 Claims, 20 Drawing Sheets

FROM FLOWCHART 1644
IN FIG.16F

1636

A FIRST LINEAR MOTOR ELEMENT OF A THIRD LINEAR MOTOR IS COUPLED TO THE SECOND-AXIS MOVEABLE STAGE PORTION

1638

A SECOND LINEAR MOTOR ELEMENT OF THE THIRD LINEAR MOTOR IS MOUNTED ON THE MOVEABLE STAGE WITH A THIRD PLURALITY OF FLEXURE PLATES

1640

A THIRD FLEXURE ROD IS COUPLED BETWEEN THE NON-ISOLATED STRUCTURE AND THE SECOND LINEAR MOTOR ELEMENT OF THE THIRD LINEAR MOTOR

1642

THE SECOND AND THIRD LINEAR MOTORS ARE CONFIGURED TO CONTROL MOVEMENT OF THE SECOND-AXIS MOVEABLE STAGE PORTION IN THE SECOND AXIS

FIG.16G

METHOD, SYSTEM, AND APPARATUS FOR MANAGEMENT OF REACTION LOADS IN A LITHOGRAPHY SYSTEM

This is a continuation application of U.S. application Ser. No. 10/095,070, filed Mar. 12, 2002, now U.S. Pat. No. 6,784,978 which is herein incorporated by reference in its entirety.

BACKGROUND OF THE INVENTION

1. Field of the Invention

The invention relates generally to the field of lithography systems and, more particularly, to management of reaction loads in a lithography tool.

2. Background Art

In the fabrication of integrated circuits, lithographic and projection printing techniques are used. Lithography is a process used to create features on the surface of substrates. Such substrates can include those used in the manufacture of flat panel displays, circuit boards, various integrated circuits, and the like. A frequently used substrate for such applications is a semiconductor wafer. During lithography, exposure optics located within a lithography apparatus project an image in a reticle onto the surface of a semiconductor wafer. The wafer is disposed on a wafer stage. The projected image produces changes in the characteristics of a layer of the wafer. For instance, a photoresist layer deposited on the surface of the wafer is etched with a pattern during the process.

Step-and-scan lithography techniques may be used to expose a wafer. Rather than expose the entire wafer at one time, individual fields are scanned onto the wafer, one at a time. This is done by moving the wafer and reticle simultaneously such that an imaging slot is moved across each field during the scan. The wafer stage is stepped between field exposures to allow multiple copies of the reticle pattern to be exposed over the wafer surface.

As a result, components are required to move in step-and-scan lithography systems. Acceleration of system components during their movement can cause a reaction load or reaction movement in components of the system being moved against, and in the support structure. Reaction movements or reaction loads lead to relative motion between critical components, and possible shaking of the support structure, which leads to reduced operational precision for the lithography system. Hence, what is needed is a method, system, and apparatus for reducing reaction loads, support structure shaking, and relative motion among lithography system components.

BRIEF SUMMARY OF THE INVENTION

A lithography apparatus that incorporates an isolation system with a reaction load management mechanism, and a method for assembling the same is described herein. The lithography apparatus includes an isolated structure, a moveable stage, a linear motor, a flexure mechanism, and a flexure rod. The isolated structure is supported by a non-isolated structure. The isolated structure supports the moveable stage. The linear motor includes a first linear motor element and a second linear motor element. The first linear motor element is coupled to the moveable stage. The second linear motor element is mounted on the isolated structure by a flexure mechanism. The flexure mechanism preferably includes a plurality of parallel flexure plates. The flexure rod is coupled between the non-isolated structure and the second linear motor element.

The parallel flexure plates form a parallel flexure mechanism that allows movement in a first linear degree of movement, parallel to the axis of motion of the stage. In further embodiments, a flexure rod coupled between the non-isolated structure and the second linear motor element accommodates the remaining two linear and three rotational degrees of freedom.

The combination of the flexure rod and parallel flexure mechanism provides a high degree of compliance in all six degrees of freedom, thus preventing vibration from being coupled from the non-isolated structure to the isolated structure. The isolated structure remains free to move with respect to non-isolated structure.

The passive flexured mechanism of the present invention directly transfers motion related loads from the second element of the linear motor to the non-isolated support structure. This transfer is accomplished without dissipating substantial power, or compromising the isolation of the structure on which the stage is mounted. By reducing the motion loads, and hence reducing the shaking of lithography system components, semiconductor wafers may be more precisely and repeatedly etched according to tighter tolerances.

The present invention reduces reaction loads related to an isolated stage mechanism that is moveable along a single axis, along two axes, and along additional axes.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 16A–G provide operational steps for assembling one or more embodiments of the present invention.

Figure 17A:
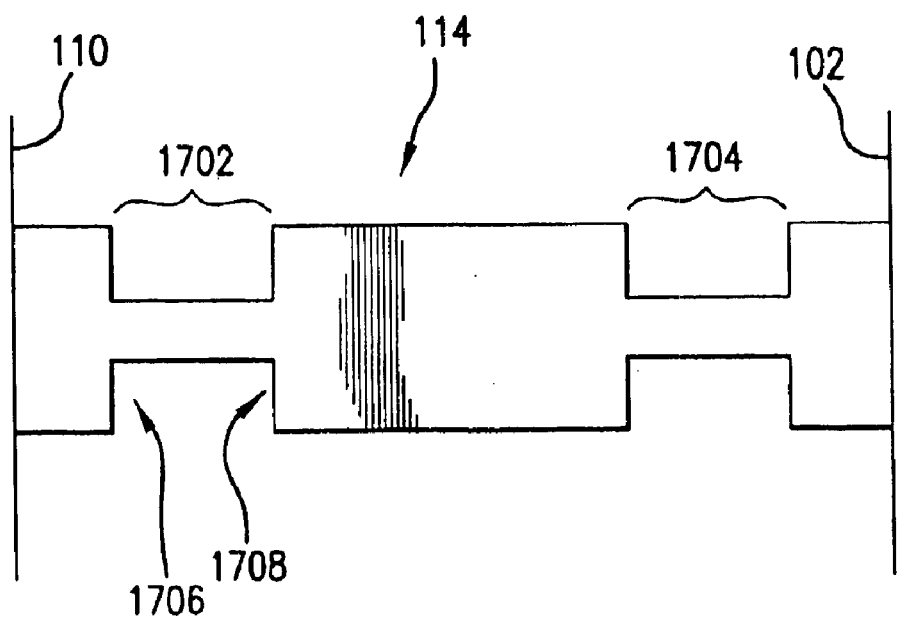
Figure 17B:
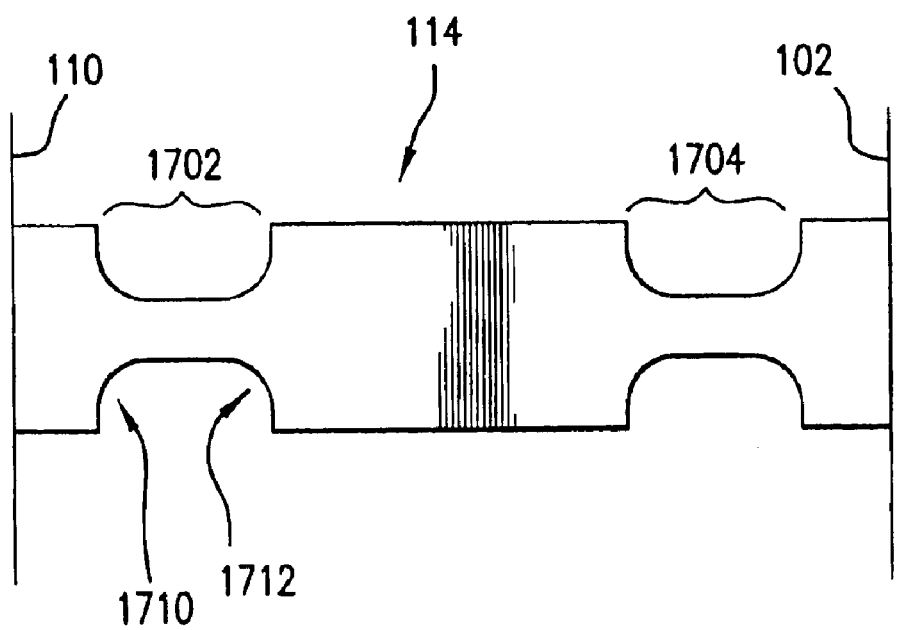

FIGS. 17A and 17B show further embodiments for a shaped flexure rod, according to the present invention.

Figure 17C:
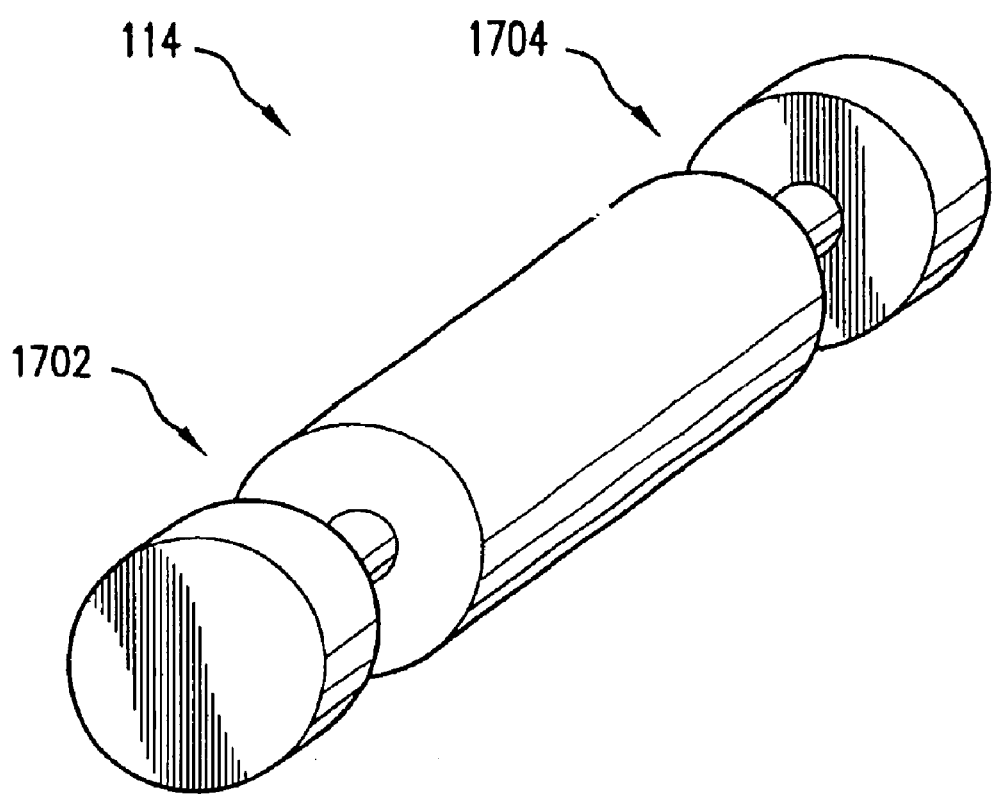

FIG. 17C shows a three-dimensional view of the flexure rod shown in FIG. 17A.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

1. Overview

The present invention is directed to a method, system, and apparatus for reducing motion loads, and hence reducing relative motion between, and the shaking of portions of a lithography tool. According to the present invention, a linear motor is used to move a lithography system stage that is mounted on an isolated structure. The linear motor includes a first linear motor element and a second linear motor element, such as a coil and a stator. The isolated structure is supported on a non-isolated support structure. The present invention uses a passive flexured mechanism to directly transfer motion related loads from the second element of the linear motor to the non-isolated support structure. This transfer is accomplished without dissipating substantial power, or compromising the isolation of the structure on which the stage is mounted. By reducing the motion loads, and hence reducing the shaking of lithography system components, semiconductor wafers may be more precisely and repeatedly etched according to tighter tolerances.

In embodiments, the passive flexured mechanism includes one or more parallel flexure plates that allow movement in a first linear degree of movement, parallel to the axis of motion of the stage. In further embodiments, a flexure rod coupled between the non-isolated structure and the second linear motor element accommodates the remaining two linear and three rotational degrees of freedom.

The combination of the flexure rod and parallel flexure mechanism provides a high degree of compliance in all six degrees of freedom, thus preventing vibration from being coupled from the non-isolated structure to the isolated structure. The isolated structure remains free to move with respect to non-isolated structure.

The present invention reduces reaction loads related to an isolated stage mechanism that is moveable along a single axis, along two axes, and along additional axes.

The next section describes an example lithography system in which the present invention may be implemented. In the subsequent section, embodiments for reaction load management according to the present invention are more fully described. In the final section, example devices used to support and isolate an isolated structure on a non-isolated structure are presented.

2. Example Lithography System

Figure 9:
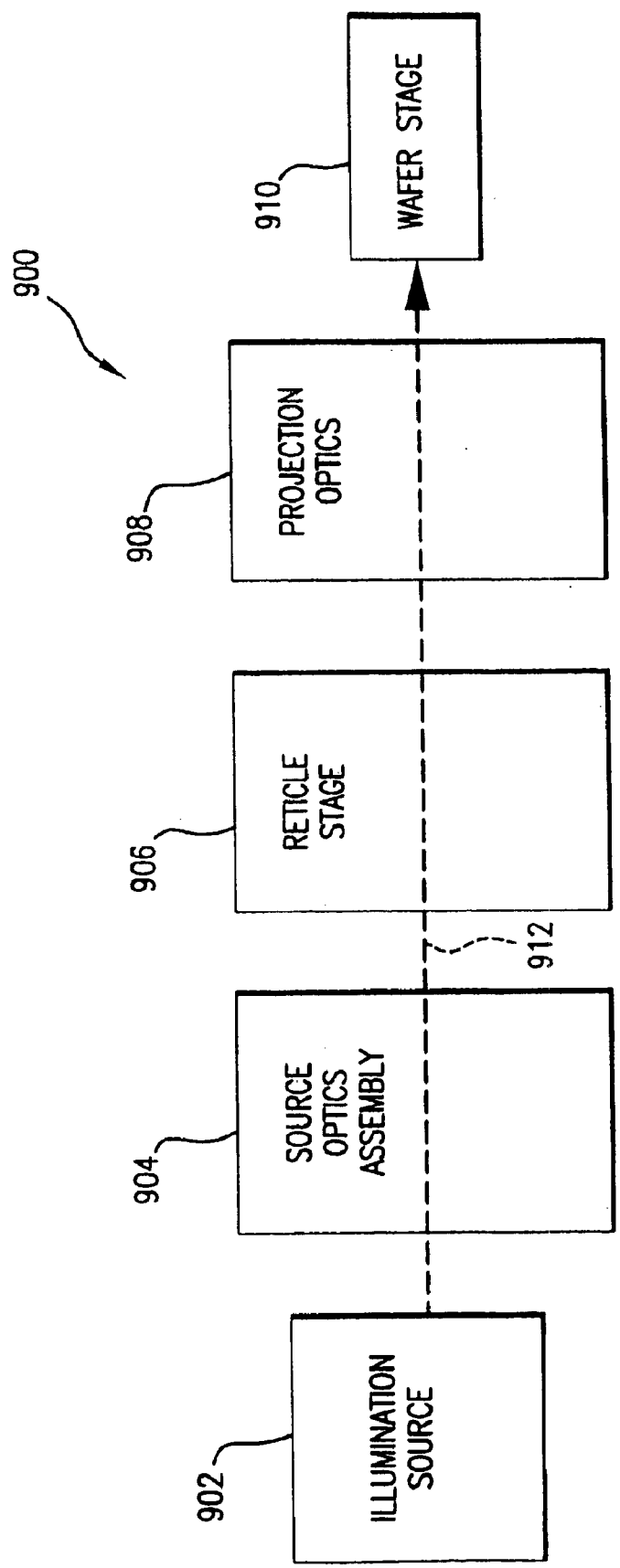
FIG. 9 illustrates relevant portions of a lithography system.

FIG. 9 illustrates relevant portions of an example lithography system 900. Lithography system 900 includes an illumination source 902, a source optics assembly 904, a reticle stage 906, a projection optics 908, and a wafer stage 910. Illumination source 902 includes a source of radiation for exposing a semiconductor wafer surface of wafer stage 910. Source optics assembly 904 includes optics necessary to guide radiation from illumination source 902 to reticle stage 906. Reticle stage 906 includes a mask with a pattern that is to be transferred to the semiconductor wafer surface of wafer stage 910 by radiation from illumination source 902. Projection optics 908 includes the optics necessary to guide the radiation transmitted through the mask pattern of a reticle in reticle stage 906 to the semiconductor wafer surface of wafer stage 910. The semiconductor wafer surface of wafer stage 910 is the surface of a semiconductor wafer to be lithographically exposed.

Illumination source 902 produces radiation 912. Radiation 912 is transmitted through source optics assembly 904 (also called illumination optics), reticle stage 906, and projection optics 908, to a semiconductor wafer surface in wafer stage 910. The pattern of the reticle in reticle stage 906 is transferred to the semiconductor wafer surface of wafer stage 910.

In lithography systems, portions or all of source optics assembly 904, reticle stage 906, projection optics 908, and wafer stage 910 are included in an isolation system (not shown), including a bridge structure to which some of these components are mounted. The isolation system attempts to minimize motion in the structure supporting these critical components. The present invention relates to a lithography tool isolation system that reduces the relative motion between critical components of a lithography tool, including the source optics, wafer stage, reticle stage, and projection optics.

For example, source optics assembly 904 can include an optical relay. The optical relay can include one or more lenses, and one or more framing blades used to frame and adjust radiation passing through the optical relay. The framing blades can be moved by linear motors to adjust the amount of radiation passing through the optical relay. It is desirable to limit motion loads due to the framing blade movement in other sensitive lithography components. For further detail on exemplary framing blades, refer to pending U.S. patent application Ser. No. 09/534,127 (attorney docket no. 1857.0130000), entitled "Scanning Framing Blade Apparatus," which is incorporated by reference in its entirety.

In another example, reticle stage 906 includes components used to move and position the reticle. It is desirable to limit motion loads due to the movement of the reticle in other sensitive lithography components.

In another example, wafer stage 910 includes components used to move and position the semiconductor wafer. It is desirable to limit motion loads due to the movement of the wafer in other sensitive lithography components.

An example system, apparatus, and method for reducing motion loads, reducing any shaking of the isolated structure, and reducing relative motion of lithography system components are described in the following section.

3. Reaction Load Management Embodiments of the Present Invention

In this section, embodiments for reaction load management according to the present invention are described at a more detailed level. The particular implementations of the present invention that are shown are presented for illustrative purposes, and are not limiting. In particular, the present invention as described herein can be adapted to any number of environments. The present invention as described herein can be implemented in any lithography system requiring a high degree of isolation from outside vibration, and a reduction in relative motion of lithography system components. For example, in embodiments, the present invention can be implemented in a Micrascan and other advanced lithography tool platforms developed by the Lithography Group of ASML US Inc., located in Wilton, Conn.

As described above, a lithography system may include moveable stages that are supported by an isolated structure. Movement of these stages may be controlled by one or more linear motors. A linear motor includes two elements, such as a linear motor stator and corresponding coil, to magnetically move a stage in a linear fashion. The linear motor is also supported on the isolated structure. The linear motor receives control signals from a computer or other controller device to control the operation of the linear motor.

When a linearly moveable stage accelerates or moves to a new horizontal position, motion loads may result, causing the isolated structure to shake and/or rock. Magnetic force actuators used in conjunction with an "anti-rock" compensation control algorithm can be used to actively counteract the motion related forces to stabilize the isolated structure. For an example of such an implementation of magnetic force actuators, refer to pending U.S. patent application Ser. No. 09/794,133 (attorney docket no. 1857.0370000), entitled "Lithographic Tool with Dual Isolation System and Method for Configuring the Same," which is incorporated by reference in its entirety. However, the magnetic force actuators required to perform this function may be large, and may dissipate a significant amount of power.

In contrast, the present invention passively counteracts motion related forces to stabilize an isolated structure in a lithography system. The present invention transfers motion loads from moveable stages to ground without significantly compromising the isolated state of the static stage structure. In embodiments, the present invention uses a passive flexured mechanism to directly transfer motion-related loads from the second linear motor element of the stage drive linear motor to the non-isolated support structure without dissipating substantial power or compromising the isolation of the structure on which the stage is mounted.

The present invention is directed to applications where a moveable stage is moveable along a single axis. The present invention is also directed to applications where the moveable stage is moveable along two or more axes. For example, a stage may be moveable along both an X axis and a Y axis, that are perpendicular to each other. One or more linear motors may be used to move the stage in each direction.

In an example embodiment, if the first linear axis of an X axis/Y axis moveable stage is driven by two separate linear motors, and each of the two motors is independently driven by a control algorithm that accounts for the position of the second linear axis of the moveable stage, the present invention effectively transfers motion-related loads produced by the first linear axis to the non-isolated structure.

Furthermore, in embodiments, a non-isolated tracking stage may be used to enhance passive compensation for reaction loads due to the second linear axis of a two-axis stage system.

Note that the center of gravity of a moveable stage is not required to be co-linear with the drive force produced by the linear motor for the disclosed invention to be effective. Furthermore, while the present invention is applicable to motors other than linear motors, linear motors can operate with relatively small clearances, which enhances drive efficiency without compromising structural isolation.

Figure 1:
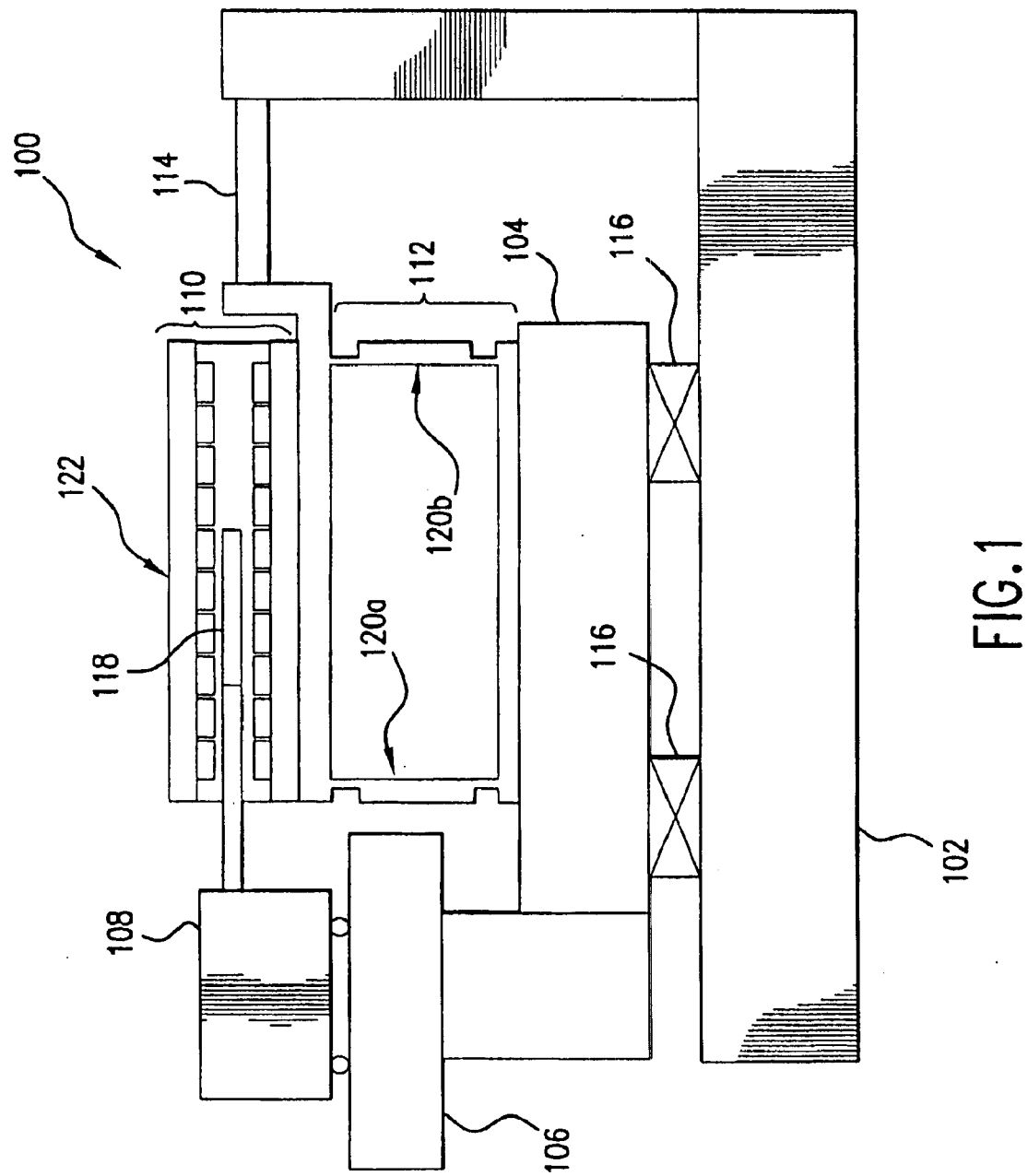
FIG. 1 illustrates a diagram of a single-axis reaction load management device, according to an example embodiment of the present invention.

FIG. 1 illustrates a block diagram of an isolation system 100 that may be implemented in a lithography system. Isolation system 100 incorporates reaction load management for a stage moveable in a single axis, according to an example embodiment of the present invention. Isolation system 100 includes a non-isolated structure 102, an isolated structure 104, a stage guide rail 106, a moveable stage 108, a linear motor 110, a parallel flexure mechanism 112, a flexure rod 114, and one or more supporting/positioning elements 116. Linear motor 110 includes a first linear motor element 118 and a second linear motor element 122.

Isolated structure 104 is typically a metal frame/bridge that supports various lithography system components requiring isolation from ground movement and vibration. For example, isolated structure 104 may support portions of, or all of projection optics 908, wafer stage 910, and reticle stage 906 (shown in FIG. 9) and related metrology components.

Isolated structure 104 is generally kept isolated from outside contact by various supports and controls. Non-isolated structure 102 supports isolated structure 104 in this manner, via one or more supporting/positioning elements 116. Non-isolated structure 102 can be any surface or special purpose structure applicable to mounting and supporting a lithography tool apparatus as described herein, such as those currently used in the art.

Supporting/positioning elements 116 may include one or more mounts, force actuators, and position sensors. For example, pneumatic isolators/mounts may be used to isolate and support a majority of the weight of isolated structure 104. Mounting springs can additionally or alternatively be used to support isolated structure 104 on non-isolated structure 102. One or more relative position sensors may be used to detect the position of isolated structure 104 relative to non-isolated structure 102. One or more force actuators, such as Lorentz actuators, may be used to control the position of isolated structure 104 relative to non-isolated structure 102. Examples of these and other applicable elements that may be included in supporting/positioning elements 116 are described in section 4.0 below.

As shown in FIG. 1, isolated structure 104 supports moveable stage 108. Moveable stage 108 may be any lithography system component or stage that is moveable on isolated structure 104, the movement of which is controlled by a linear motor. For example, moveable stage 108 may be a stage that includes framing blades, wafer stage 910, or reticle stage 906 (shown in FIG. 9). As shown in FIG. 1, the movement of moveable stage 108 may be guided by an optional stage guide rail 106 or other means.

Linear motor 110 drives moveable stage 108 in a linear direction. Linear motor 110 may be any applicable linear motor known to persons skilled in the relevant art(s). As described above, linear motor 110 includes first linear motor element 118 and second linear motor element 122. First linear motor element 118 and second linear motor element 122 are electromagnetic devices, where a current applied to one of the elements generates an electromagnetic force, causing an equal and opposite force reaction in the other element. Hence, the movement of one of the elements is controlled by a current applied to the other element. For example, linear motor 110 may be a three-phase sinusoidally commutated moving coil linear motor. Linear motor 110 may be commutated (e.g., have multiple coils), digitally or otherwise, or may be non-commutated. Linear motor 110 may include a permanent magnetic used to move a coil that includes iron, or may be an alternative linear motor type.

As shown in FIG. 1, first linear motor element 118 is attached to moveable stage 108. Second linear motor element 122 is mounted on parallel flexure mechanism 112. In the example of FIG. 1, first linear motor element 118 is shown as a linear motor coil, and second linear motor element 122 is shown as a linear motor stator. In FIG. 1, second linear motor element 122 operates to apply a controlled magnetic force on first linear motor element 118 to move first linear motor element 118, and thereby move moveable stage 108. In other words, in the example of FIG. 1, the stator of second linear motor element 122 operates to apply a controlled magnetic force on the coil of first linear motor element 118. Note that in an alternative embodiment, the devices used for second linear motor element 122 and first linear motor element 118 may be exchanged, such that first linear motor element 118 is a linear motor stator, and second linear motor element 122 is a linear motor coil, or they may be alternative linear motor device types, as described above. However, in FIGS. 1, 2, and 4, first linear motor element 118 is shown as a linear motor coil and second linear motor element 122 is shown as a linear motor stator, for purposes of illustration.

Flexure rod 114 couples second linear motor element 122 directly to non-isolated structure 102. Flexure rod 114 carries reaction loads from second linear motor element 122 to ground without shaking isolated structure 104. Flexure rod 114 allows flex/movement in five degrees of freedom, and is rigid in one degree of freedom.

Figure 5:
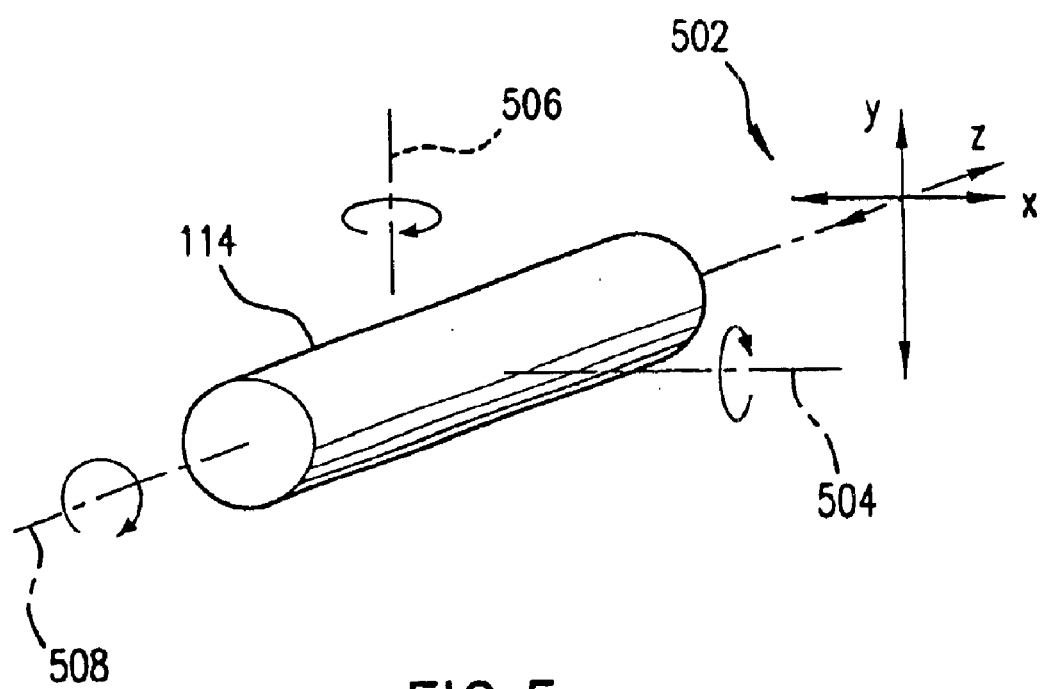
FIG. 5 illustrates a perspective view of an example flexure rod, according to an embodiment of the present invention.

Flex characteristics of flexure rod 114 are illustrated in FIG. 5. FIG. 5 shows a perspective view of flexure rod 114, according to an embodiment of the present invention. An axis direction indicator 502 indicates the directions of the X, Y, and Z linear axes in relation to flexure rod 114. Flexure rod 114 allows for flex in the X and Y linear axes (i.e., two linear degrees of freedom) by flexing in these directions when second linear motor element 122/isolated structure 104 (shown in FIG. 1) moves in relation to non-isolated structure 102, and vice versa.

Flexure rod 114 also allows for rotational flex in the three rotational axes (i.e., three rotational degrees of freedom). A first, a second, and a third rotational axis 504, 506, and 508 are shown in FIG. 5. Flexure rod 114 allows for rotational flex along first rotational axis 504 (around the X linear axis). Flexure rod 114 also allows for rotational flex along second rotational axis 506 (around the Y linear axis). Flexure rod 114 also allows for rotational flex third rotational axis 508 (around the Z linear axis). Hence, flexure rod 114 allows second linear motor element 122/isolated structure 104 to rotate in the three rotational axes or degrees of freedom in relation to non-isolated structure 102, and vice versa. Hence, flexure rod 114 allows for a total of five degrees of freedom of motion for isolated structure 104.

As shown in FIGS. 1 and 5, flexure rod 114 may be a solid or hollow rod. Flexure rod 114 may be configured in other shapes, depending on the particular application, as would be understood by persons skilled in the relevant art(s) from the teachings herein. For example, flexure rod 114 may be formed to have a cross-section that is elliptical, square, rectangular, and any other polygon/shape. Furthermore, flexure rod 114 may be formed from metal, plastic, ceramic, or glass, or a combination thereof. For example, a first segment of flexure rod 114 may be made from a first material, and a second segment may be made from another material, etc. Furthermore, flexure rod 114 may be manufactured by a variety of known processes, including molding and milling. A first end of flexure rod 114 is attached to second linear motor element 122 or its support structure, and a second end of flexure rod 114 is attached to non-isolated structure 102 by any of a variety of attachment mechanisms. For example, one or both may be attached by one or more screws or by welding, or may be formed as a single piece of metal with one or both of the support structure for second linear motor element 122 and non-isolated structure 102.

Figure 6:
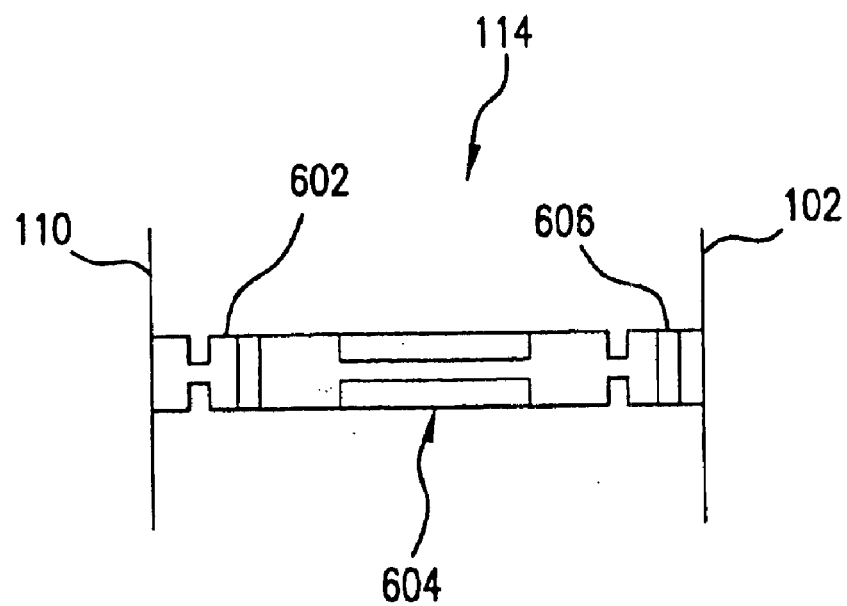
FIG. 6 illustrates an example flexure rod, formed according to an embodiment of the present invention.
Figure 7:
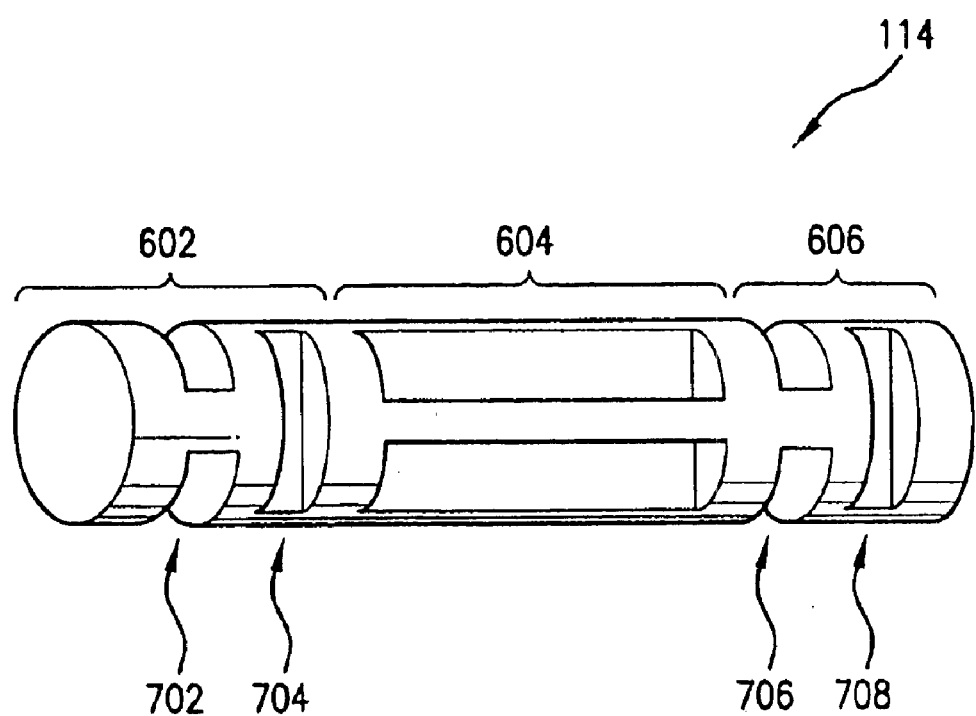
FIG. 7 shows a three-dimensional view of the flexure rod shown in FIG. 6.

Additionally, flexure rod 114 may be further formed or shaped to enhance its flex characteristics. FIG. 6 illustrates a side view of an example flexure rod 114, further shaped according to an embodiment of the present invention. FIG. 7 shows a perspective view of flexure rod 114 shown in FIG. 6. As shown in FIGS. 6 and 7, flexure rod 114 includes a first double-cut flexure portion 602, a cruciform flexure portion 604, and a second double-cut flexure portion 606. First and second double-cut flexure portions 602 and 606 primarily allow for improved flex in the two linear degrees of freedom (i.e., X and Y axes shown in FIG. 5) and two rotational degrees of freedom (i.e., first and second rotational axes 504 and 506). As shown in FIG. 7, first double-cut flexure portion 602 includes a pair of horizontal cuts 702 and a pair of vertical cuts 704. Second double-cut flexure portion 606 includes a pair of horizontal cuts 706 and a pair of vertical cuts 708. Cruciform flexure portion 604 primarily allows for improved flex in one rotational degree of freedom (i.e., third rotational axis 508). Cruciform flexure portion 604 is formed to have a cross-shaped cross-section. The depth and width of horizontal and vertical cuts 702, 704, 706, and 708, and of the cuts forming cruciform flexure portion 604 may be selected according to the particular application, depending the amount of flexure required to sufficiently compensate for reaction loads. First double-cut flexure portion 602, cruciform flexure portion 604, and second double-cut flexure portion 606 may be formed according to other proportions and shapes, as would be known by a person skilled in the relevant art(s) from the teachings herein.

Figure 8:
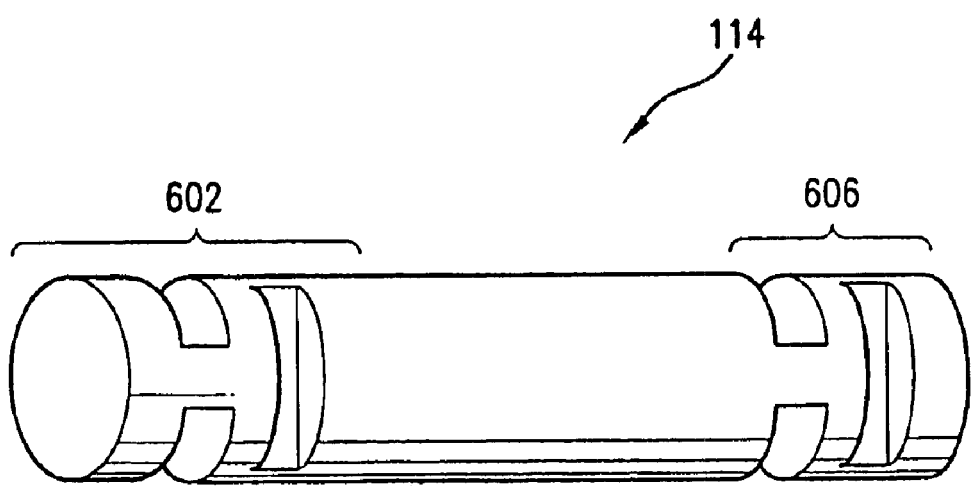
FIG. 8 shows a three-dimensional view of a flexure rod, formed according to an alternative embodiment of the present invention.

In an alternative embodiment, flexure rod 114 may include only one of either first and second double-cut flexure portions 602 and 606 and cruciform flexure portion 604. For example, FIG. 8 shows an example flexure rod 114, with first and second double-cut flexure portions 602 and 606, according to an embodiment of the present invention. Flexure rod 114 may flex sufficiently along third rotational axis 508 without cruciform flexure portion 604. The central portion of flexure rod 114 may alternatively be thickened or thinned to provide the desired amount of flex along third rotational axis 508.

FIGS. 17A and 17B show further embodiments for a shaped flexure rod 114, according to the present invention. FIG. 17C shows a three-dimensional view of flexure rod 114 shown in FIG. 17A. As shown in FIGS. 17A and 17B, flexure rod 114 includes first "necked" necked portion 1702 and a second "necked" portion 1704. First and second necked portions 1702 and 1704 allow for some increased flex in the two linear degrees of freedom (i.e., X and Y axes shown in FIG. 5) and three rotational degrees of freedom (i.e., first, second, and third rotational axes 504, 506, and 508). In embodiments, first and second necked portions 1702 and 1704 may be gradually or abruptly formed in flexure rod 114. For example, as shown in FIG. 17A, a first end 1706 and a second end 1708 of necked portion 1702 have relatively sharp corners, and are hence abruptly formed in flexure rod 114. Conversely, as shown in FIG. 17B, a first end 1710 and a second end 1712 of necked portion 1702 gradually merge from the full diameter of flexure rod 114 to the narrower diameter of necked portion 1702, and hence are blended or gradually formed in flexure rod 114. The present invention is adaptable to further shapes for necked portions in flexure rod 114, and to any number necked portions in flexure rod 114, according to the requirements of the particular application.

Furthermore, in alternative embodiments, a universal joint may be used in flexure rod 114 instead of one or both of first and second double-cut flexure portions 602 and 606. Furthermore, a rotary bearing may be used in flexure rod 114 instead of cruciform flexure 604. Still further, a spherical joint may used in one or both ends of flexure rod 114 instead of cruciform flexure 604 and first and second double-cut flexure portions 602 and 606. The present invention is applicable to any combination of the different forms or modifications to flexure rod 114 discussed herein. Note that flexure devices tend to respond in a highly predictable manner for a small range of motions. Joints that utilize sliding or rolling motions may have less predictable responses than flexure devices. Furthermore, flexure devices typically do not require lubrication, and do not wear rapidly when designed to limit stress levels.

As shown in FIG. 1, second linear motor element 122 of linear motor 110 is mounted on parallel flexure mechanism 112. Parallel flexure mechanism 112 shown in FIG. 1 includes a first and a second parallel flexure plate 120a and 120b. First and second parallel flexure plate 120a and 120b effectively decouple the reaction force produced by linear motor 110 from the supporting isolated structure 104.

Figure 10:
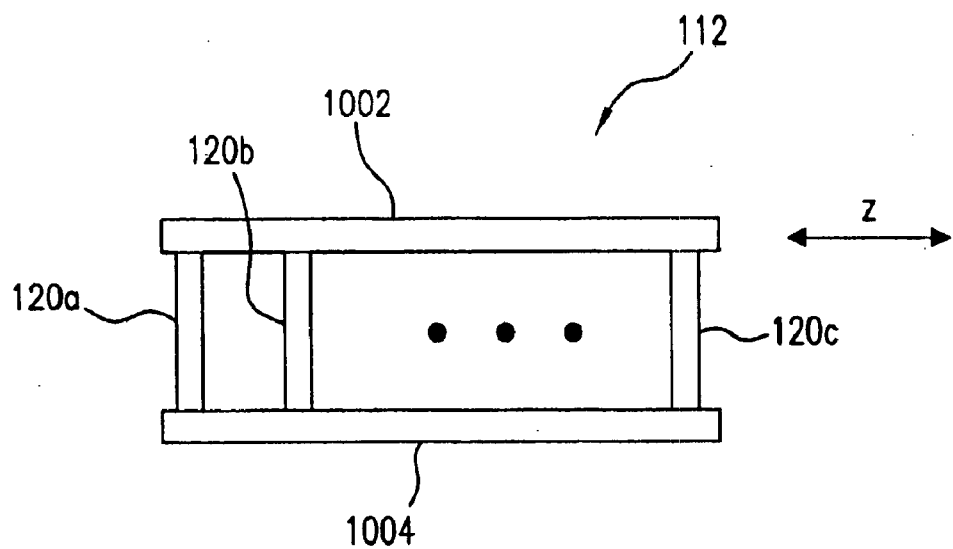
FIG. 10 illustrates an example flexure mechanism, according to an embodiment of the present invention.

FIG. 10 illustrates an example parallel flexure mechanism 112, according to an embodiment of the present invention. Parallel flexure mechanism 112 allows flex/movement in the sixth degree of freedom (i.e., the Z linear axis shown in FIG. 5). As shown in FIG. 10, parallel flexure mechanism 112 includes first, second, and third parallel flexure plates 120a, 120b, and 120c, and may include a first and a second bracket 1002 and 1004 within which the parallel flexure plates are mounted. Alternatively, parallel flexure mechanism 112 does not include first and second brackets 1002 and 1004, and the parallel flexure plates attach directly to isolated structure 104 and the structure of second linear motor element 122. Parallel flexure mechanism 112 is attached to isolated structure 104 and the structure of second linear motor element 122 by one or more screws, by welding, or any other applicable attachment mechanism, as would be apparent to persons skilled in the relevant art(s).

Parallel flexure mechanism 112 may include any number of two or more parallel flexure plates. A plurality of flexure plates 120 may be uniformly or non-uniformly spaced apart in parallel flexure mechanism 112. Additionally or alternatively, one or more flexure plates 120 may be arranged in contact with each other, side-by-side, in parallel flexure mechanism 112.

Figure 11:
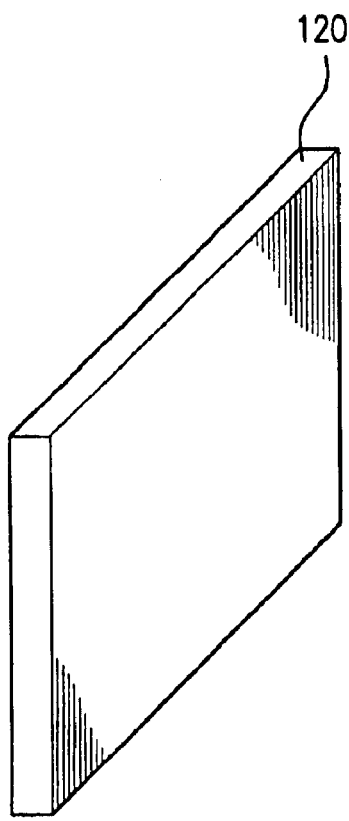
FIGS. 11–14 illustrate example flexure plates, according to embodiments of the present invention.

FIGS. 11–14 illustrate example flexure plates, according to embodiments of the present invention. FIG. 11 shows an example flexure plate 120, which is uniformly rectangular shaped. Flexure plate 120 is preferably made of metal, but may also be formed from plastic, ceramic, or glass, or a combination thereof. Flexure plate 120 may be manufactured by a variety of known processes, including molding and milling.

Figure 12:
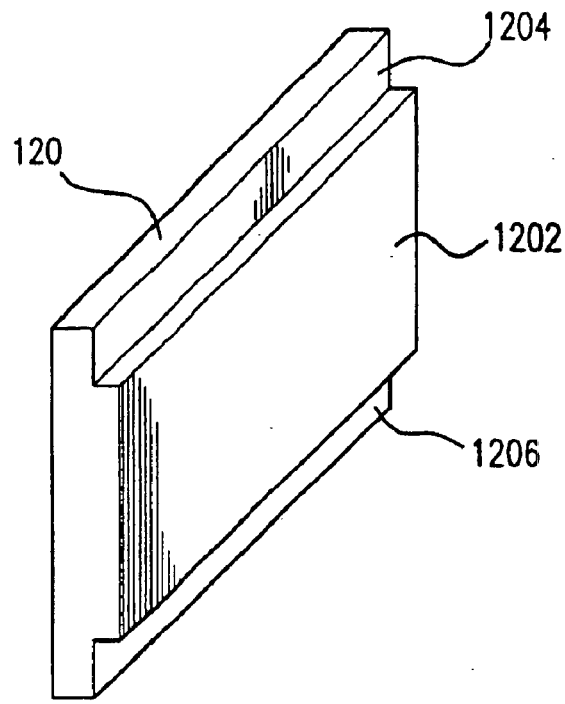
Figure 13:
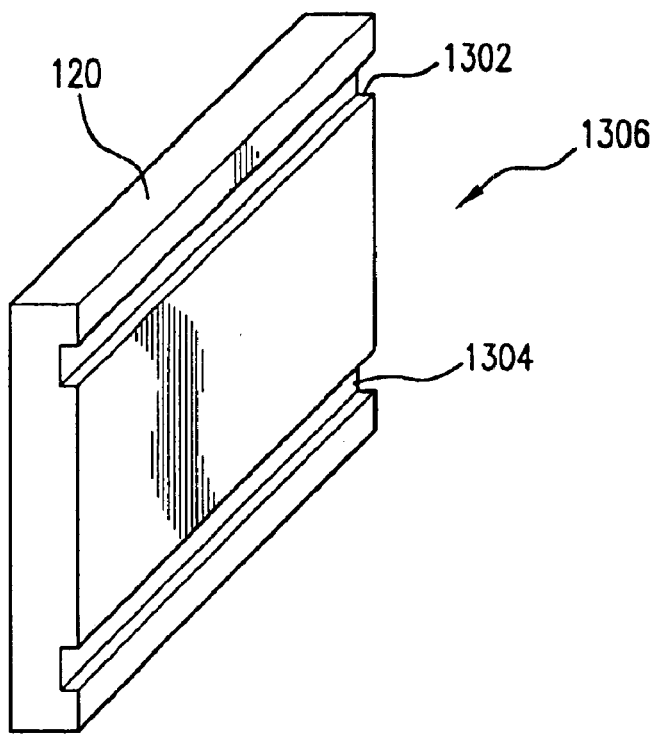
Figure 14:
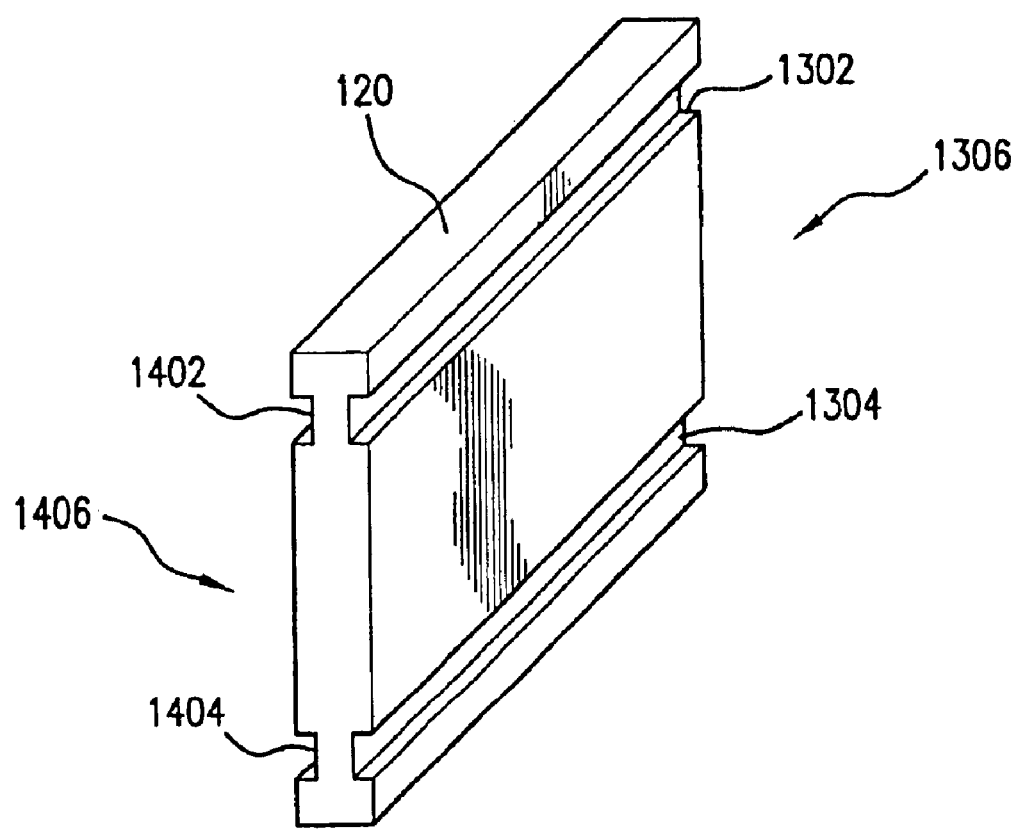

Flexure plate 120 may be further shaped to enhance its flex characteristics. For example, if flexure plate 120 is too thin, it may buckle when under pressure. One or more cuts may be formed in flexure plate 120 to allow for greater flex without buckling. FIG. 12 shows a flexure plate 120 where a central portion 1202 is thicker than first and second end portions 1204 and 1206, to strengthen the central area of flexure plate 120. FIG. 13 shows a flexure plate 120 with first and second cuts 1302 and 1304, which allow for greater flex in flexure plate 120, without buckling. First and second cuts 1302 and 1304 are made on a first side 1306 of flexure plate 120, as shown in FIG. 13. FIG. 14 shows a flexure plate 120 with first and second cuts 1302 and 1304 made on first side 1306, and a third and a fourth cut 1402 and 1404 made on a second side 1406 of flexure plate 120, to provide different flex characteristics. Any number of one or more cuts or features may be formed in flexure plate 120 when desired for a particular application.

Figure 15A:
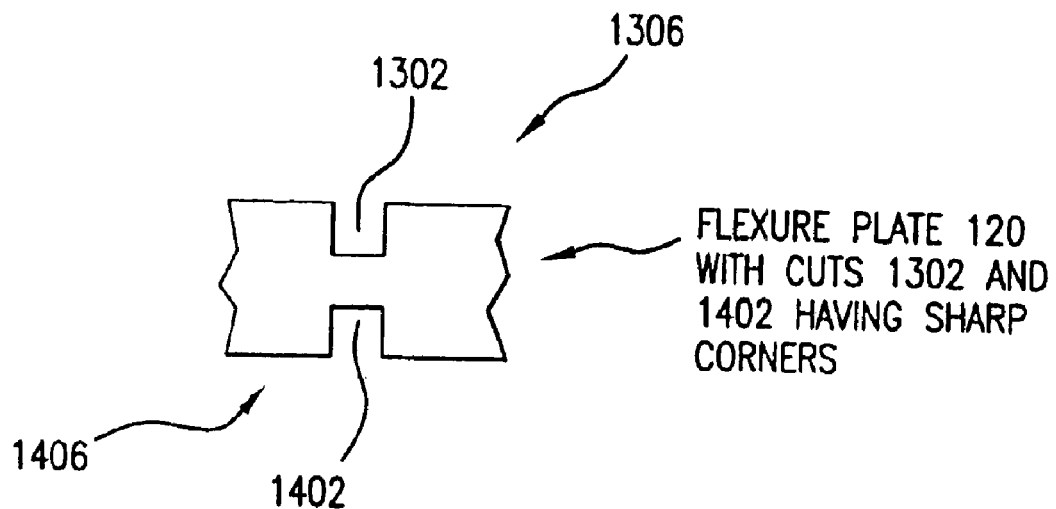
FIGS. 15A and 15B show cross-sectional views of example cuts in a flexure plate, according to embodiments of the present invention.
Figure 15B:
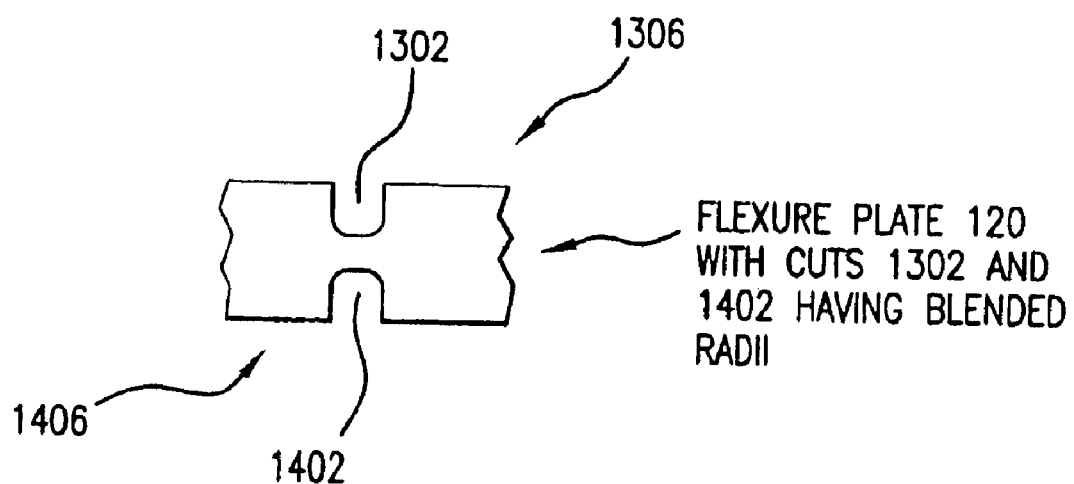

Furthermore, features and cuts that are formed in flexure plate 120 may themselves be shaped to enhance the flex characteristics of flexure plate 120. FIGS. 15A and 15B show cross-sectional views of example cuts in flexure plate 120, according to embodiments of the present invention. FIGS. 15A and 15B show a flexure plate 120 with cuts 1302 and 1402 on first and second sides 1306 and 1406, respectively. In FIG. 15A, cuts 1302 and 1402 are substantially rectangular shaped, having sharp inner corners. In FIG. 15B, cuts 1302 and 1402 include curved portions, or blended radii. Blended radii in cuts 1302 and 1402 enhance flex characteristics in flexure plate 120, while offering improved resistance to buckling. The cross-section of cuts in flexure plate 120 may be formed in any shape, including curved, squared, triangular, and any other polygon.

In an alternative embodiment, one or more low friction linear bearings may be used to replace, or may be used in addition to one or more flexure plates in parallel flexure mechanism 112.

The combination of the flexure rod 114 and parallel flexure mechanism 112 provides a high degree of compliance in all six degrees of freedom, thus preventing vibration from being coupled from non-isolated structure 102 to isolated structure 104. Isolated structure 104 remains free to move with respect to non-isolated structure 102, with flexure rod 114 accommodating the two linear and three rotational degrees of freedom, and parallel flexure mechanism 112 accommodating the third linear degree of freedom. In a preferred embodiment, the axis of motion of moveable stage 108 is parallel to the axis of movement of parallel flexure mechanism 112 (i.e., the Z linear axis). Typically, flexure rod 114 is mounted directly in line with the center of mass of moveable stage 108, thus eliminating reaction moments, but may also be otherwise mounted.

Sub-section 3.1 describes example isolation systems implemented in lithography systems that incorporate embodiments of the present invention. Sub-section 3.2 thereafter describes processes for assembling embodiments of the present invention.

3.1 Example Isolation Systems Incorporating Embodiments of the Present Invention Further details of isolation systems that incorporate embodiments of the present invention are described in this section. These embodiments are described herein for illustrative purposes, and are not limiting. The description below is adaptable to these and other isolation systems, as would be understood to persons skilled in the relevant art(s) from the teachings herein.

3.1.1 Single Axis Moveable Stage

Figure 2:
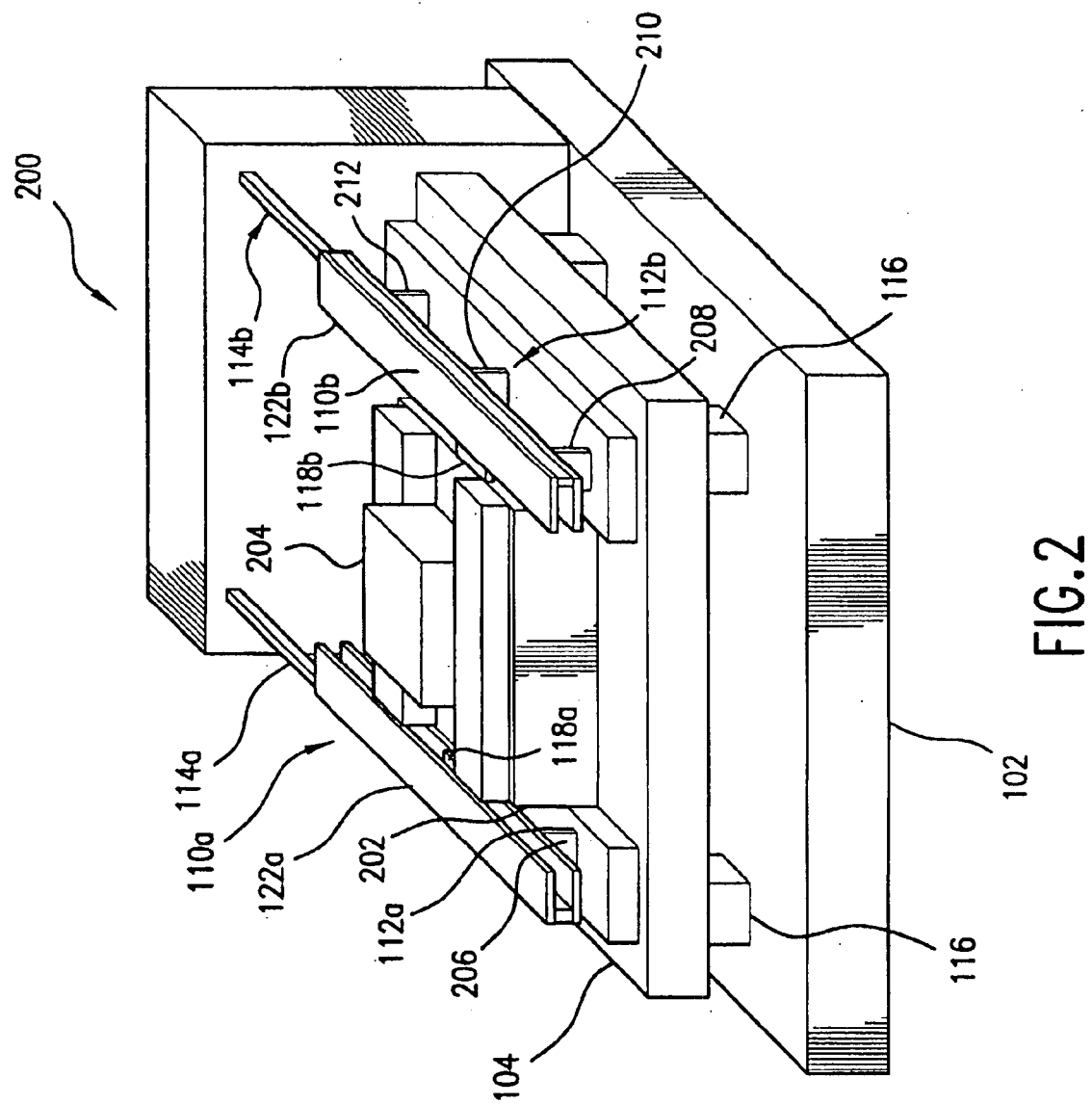
FIG. 2 illustrates a perspective view of an isolation system with a single-axis reaction load management device, according to an example embodiment of the present invention.

FIG. 2 illustrates a three-dimensional block diagram perspective view of an isolation system 200 that may be implemented in a lithography system. Isolation system 200 incorporates reaction load management for a stage moveable in a single axis, according to an example embodiment of the present invention. Isolation system 200 includes non-isolated structure 102, isolated structure 104, a first parallel flexure mechanism 112a, a second parallel flexure mechanism 112b, a first flexure rod 114a, a second flexure rod 114b, one or more supporting/positioning elements 116, a first linear motor element 118a, a first linear motor element 118b, a second linear motor element 122a, a second linear motor element 122b, a moveable stage first axis portion 202, and a moveable stage second axis portion 204.

Second linear motor element 122a and first linear motor element 118a are included in a first linear motor 110a, and second linear motor element 122b and first linear motor element 118b are included in a second linear motor 110b. First and second linear motors 110a and 110b operate together to move moveable stage 108 (shown as moveable stage first axis portion 202 and moveable stage second axis portion in FIG. 2). Note that any number of one or more linear motors may be used together to cause movement of a moveable stage, according to the present invention.

In embodiments, moveable stage 108 can include a first portion that is moveable along a first axis, and a second portion that is moveable along a second axis. Moveable stage first axis portion 202 is the portion of moveable stage that is moveable along the first axis. Moveable stage second axis portion 204 is the portion of moveable stage 108 that is moveable along the second axis. However, in FIG. 2, only moveable stage first axis portion 202 is shown as moveable. Moveable stage first axis portion 202 is moveable by first linear motor 110a and second linear motor 110b, working together. Moveable stage first axis portion 202 is supported on isolated structure 104. Moveable stage second axis portion 204 is supported on moveable stage first axis portion 202.

As shown in FIG. 2, non-isolated structure 102 supports isolated structure 104 via one or more supporting/positioning elements 116.

First linear motor elements 118a and 118b are attached to moveable stage first axis portion 202 of moveable stage 108. Second linear motor elements 122a and 122b operate to apply controlled magnetic forces on first linear motor elements 118a and 118b, respectively, to move moveable stage first axis portion 202 along the first axis. Note that in alternative embodiments, first linear motor elements 118a and 118b can operate to apply controlled magnetic forces on second linear motor elements 122a and 122b.

First flexure rod 114a couples second linear motor element 122a directly to non-isolated structure 102. Second flexure rod 114b couples second linear motor element 122b directly to non-isolated structure 102. First and second flexure rods 114a and 114b allow flex/movement in five degrees of freedom, and are rigid in one degree of freedom. First and second flexure rods 114a and 114b carry reaction loads to ground without shaking isolated structure 104.

As shown in FIG. 2, second linear motor element 122a is mounted on first parallel flexure mechanism 112a. Second linear motor element 122b is mounted on second parallel flexure mechanism 112b. First and second parallel flexure mechanisms 112a and 112b allow flex/movement in the sixth degree of freedom. First parallel flexure mechanism 112a includes three parallel flexure plates. Only a single flexure plate, first parallel flexure plate 206, is visible in FIG. 2. Second parallel flexure mechanism 112b includes three parallel flexure plates: first, second, and third parallel flexure plates 208, 210, and 212. Parallel flexure plates effectively decouple the reaction force produced by their respective linear motors from the supporting isolated structure 104.

3.1.2. Two-axis Moveable Stage

Figure 4:
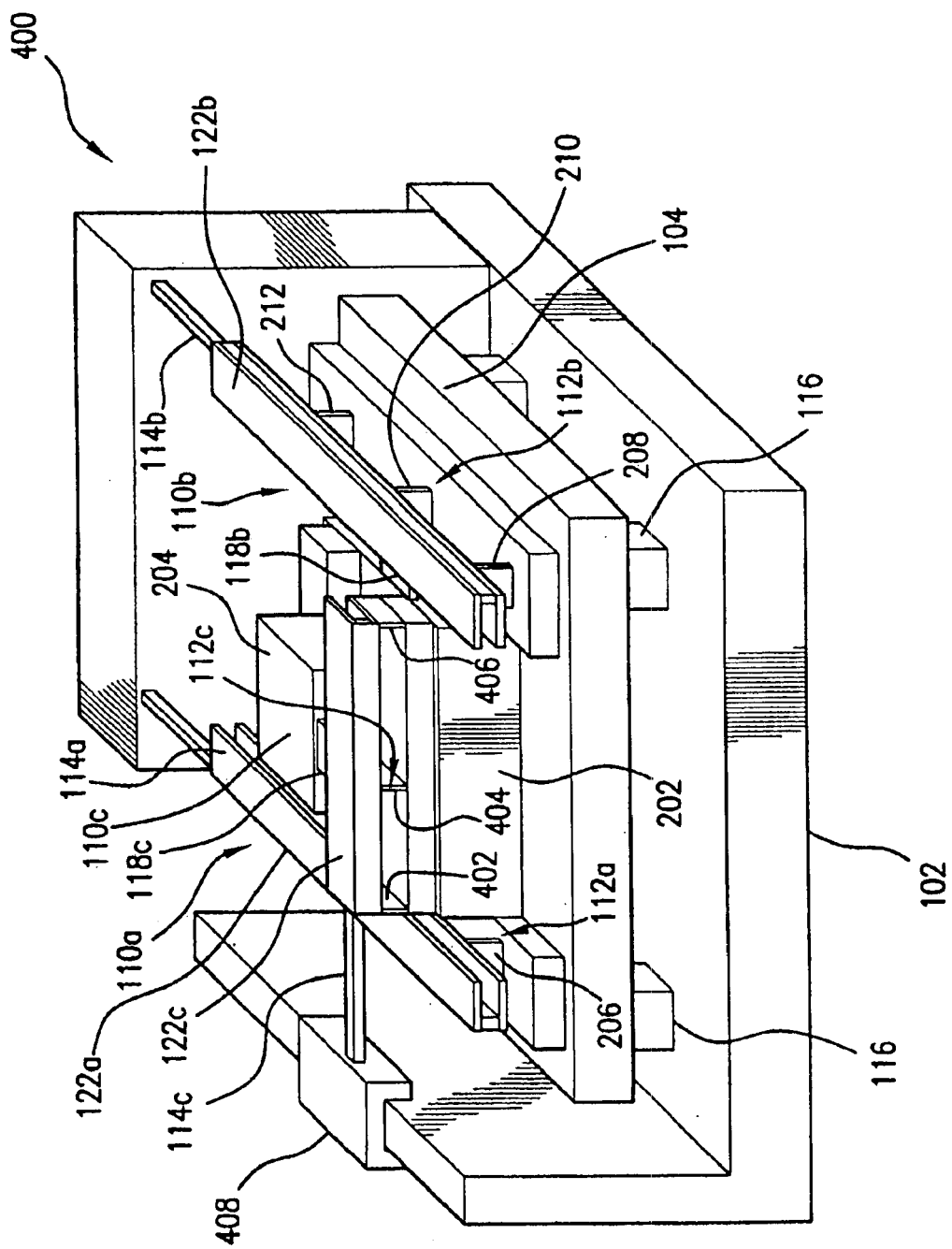
FIG. 4 illustrates a perspective view of an isolation system with a two-axis reaction load management device, according to an example embodiment of the present invention.

In the embodiment shown in FIG. 2, only moveable stage first axis portion 202 is shown as moveable. FIG. 4 illustrates a three-dimensional block diagram perspective view of an isolation system 400, according to the present invention. Isolation system 400 incorporates reaction load management for a stage moveable in a first and a second axis.

Isolation system 400 is substantially similar to isolation system 200, except for the additional capability of movement of moveable stage 108 along a second axis. In addition to the elements shown in FIG. 2 and described above, isolation system 400 includes a second axis second linear motor element 122c, a second axis first linear motor element 118c, a second axis parallel flexure mechanism 112c, a second axis flexure rod 114c, and a tracking stage 408.

Second axis second linear motor element 122c and second axis linear motor coil 122c are included in a second axis linear motor 110c. Second axis linear motor 110c operates to move moveable stage second axis portion 204 in relation to moveable stage first axis portion 202. Second axis first linear motor element 118c is attached to moveable stage second axis portion 204 of moveable stage 108. Second axis second linear motor element 122c operates to apply controlled magnetic forces on second axis first linear motor element 118c, to move moveable stage second axis portion 204 along the second axis. Note that in an alternative embodiment, second axis first linear motor element 118c can operate to apply controlled magnetic forces on second axis second linear motor element 122c.

Second axis flexure rod 114c couples second axis second linear motor element 122c directly to non-isolated structure 102. Second axis flexure rod 114c couples second axis second linear motor element 122c directly to non-isolated structure 102. Second axis flexure rod 114c allows flex/movement in five degrees of freedom, and is rigid in one degree of freedom. Second axis flexure rod 114c carries reaction loads to ground without shaking isolated structure 104.

As shown in FIG. 4, second axis second linear motor element 122c is mounted on second axis parallel flexure mechanism 112c. Second axis second linear motor element 122c is mounted on second axis parallel flexure mechanism 112c. Second axis parallel flexure mechanism 112c allows flex/movement in the sixth degree of freedom. Second axis parallel flexure mechanism 112c includes three parallel flexure plates: first parallel flexure plate 402, second parallel flexure plate 404, and third parallel flexure plate 406. The parallel flexure plates effectively decouple the reaction force produced by linear motor 110c from the supporting isolated structure 104.

In a preferred embodiment, when isolated structure 104 supports a stage with two orthogonal linear axes (such as shown in FIG. 4), the base axis (i.e., moveable stage first axis 202) is driven by two separate linear motors. As shown in FIG. 4, moveable stage first axis portion 202 is driven by two linear motors, first linear motor 10a and second linear motor 10b. This arrangement makes it possible for the stage controller (not shown) to actively proportion the ratio of drive forces used in the two linear motors based upon the position of the second axis stage portion (e.g., moveable stage second axis portion 204). This maintains the effective line of the combined drive force in line with the center of gravity of the moving stage components. Hence, resulting reaction forces and reaction moments can be eliminated without either linear motor located directly in line with the center of the moveable stage mass.

As described above, FIG. 4 shows the added components used to passively compensate for the reaction from both axes of a two-axis stage system. The second axis stage portion is driven by a single linear motor, linear motor 110c, which is not positioned in line with the moving center of mass. To aid in compensating for this, the reaction load from the second axis may be coupled by flexure rod 114c to a tracking stage 408 that is mounted directly on non-isolated structure 102. Tracking stage 408 tracks the position of moveable stage second axis portion 204. In alternative embodiments, two or more linear motors can be used to drive moveable stage second axis portion 204. However, full reaction force compensation can be accomplished with a single linear motor. Generally, reaction moments from acceleration of the moveable stage second axis portion 204 may be compensated by driving the first axis linear motors, first and second linear motors 110a and 110b, in opposite directions using a control signal amplitude proportional to the acceleration of the moveable stage second axis portion 204.

3.2 Processes for Assembling Embodiments of the Present Invention

In this section, embodiments for assembling passive reaction load management devices of the present invention are provided. These implementations are described herein for illustrative purposes, and are not limiting. The description below is adaptable to any lithography system, as would be understood to persons skilled in the relevant art(s) from the teachings herein.

Figure 16A:
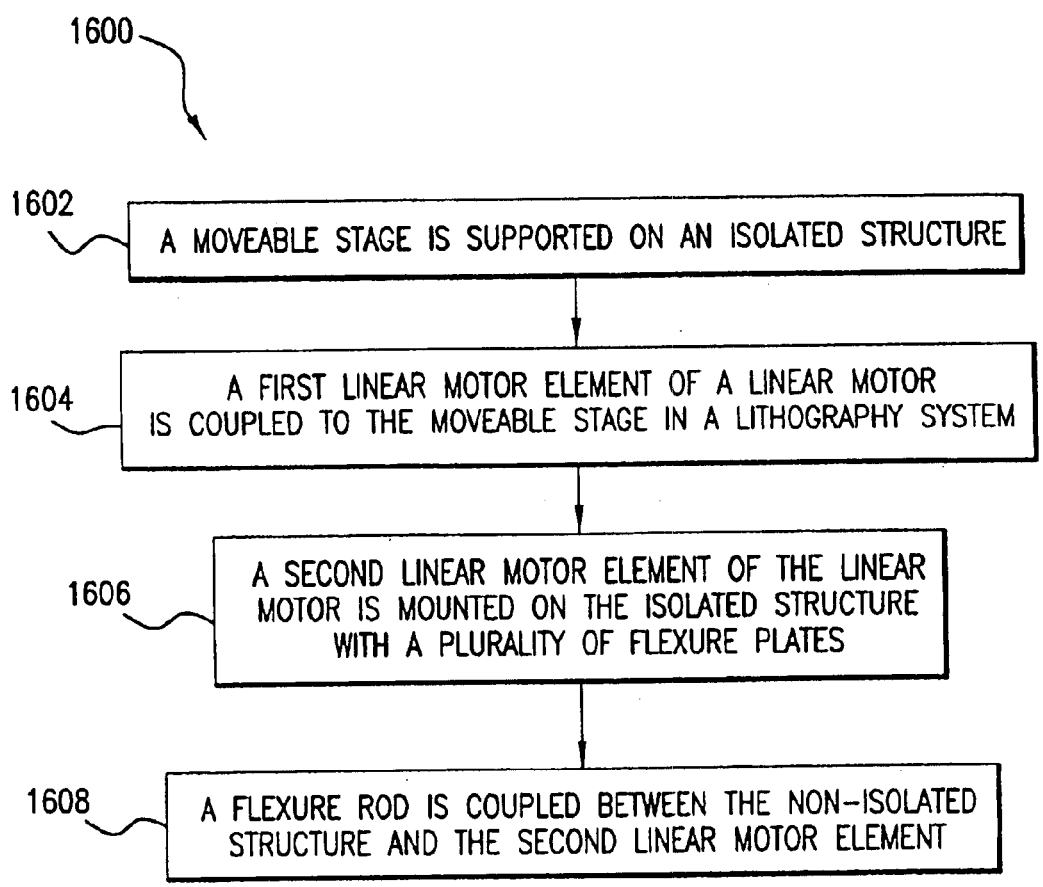

FIG. 16A shows a flowchart 1600 providing operational steps for assembling one or more embodiments of the present invention. FIGS. 16B–G provide operational steps according to further embodiments. Optional steps according to the further embodiments are indicated by dotted lines. The steps of FIGS. 16A–G do not necessarily have to occur in the order shown, as will be apparent to persons skilled in the relevant art(s) based on the teachings herein. Other structural embodiments will be apparent to persons skilled in the relevant art(s) based on the following discussion.

Flowchart 1600 begins with step 1602. In step 1602, a moveable stage is supported on an isolated structure. For example, the moveable stage is moveable stage 108, which is supported on isolated structure 104, as shown in FIG. 1.

In step 1604, a first linear motor element of a linear motor is coupled to the moveable stage. The linear motor can be linear motor 110, which includes first linear motor element 118 that is coupled to moveable stage 108. The first linear motor element can be a coil or a stator of the linear motor, for example.

In step 1606, a second linear motor element of the linear motor is mounted on the isolated structure with a plurality of flexure plates. For example, in an embodiment, the second linear motor element is second linear motor element 122 of linear motor 110. Second linear motor element 122 is mounted on isolated structure 104 by a plurality of flexure plates, which can include flexure plates 120a and 120b shown in FIG. 1. The second linear motor element can be a stator or coil of the linear motor, for example.

In step 1608, a flexure rod is coupled between the non-isolated structure and the second linear motor element. For example, the flexure rod is flexure rod 114 shown in FIG. 1, which is coupled between non-isolated structure 102 and second linear motor element 122.

Figure 16B:
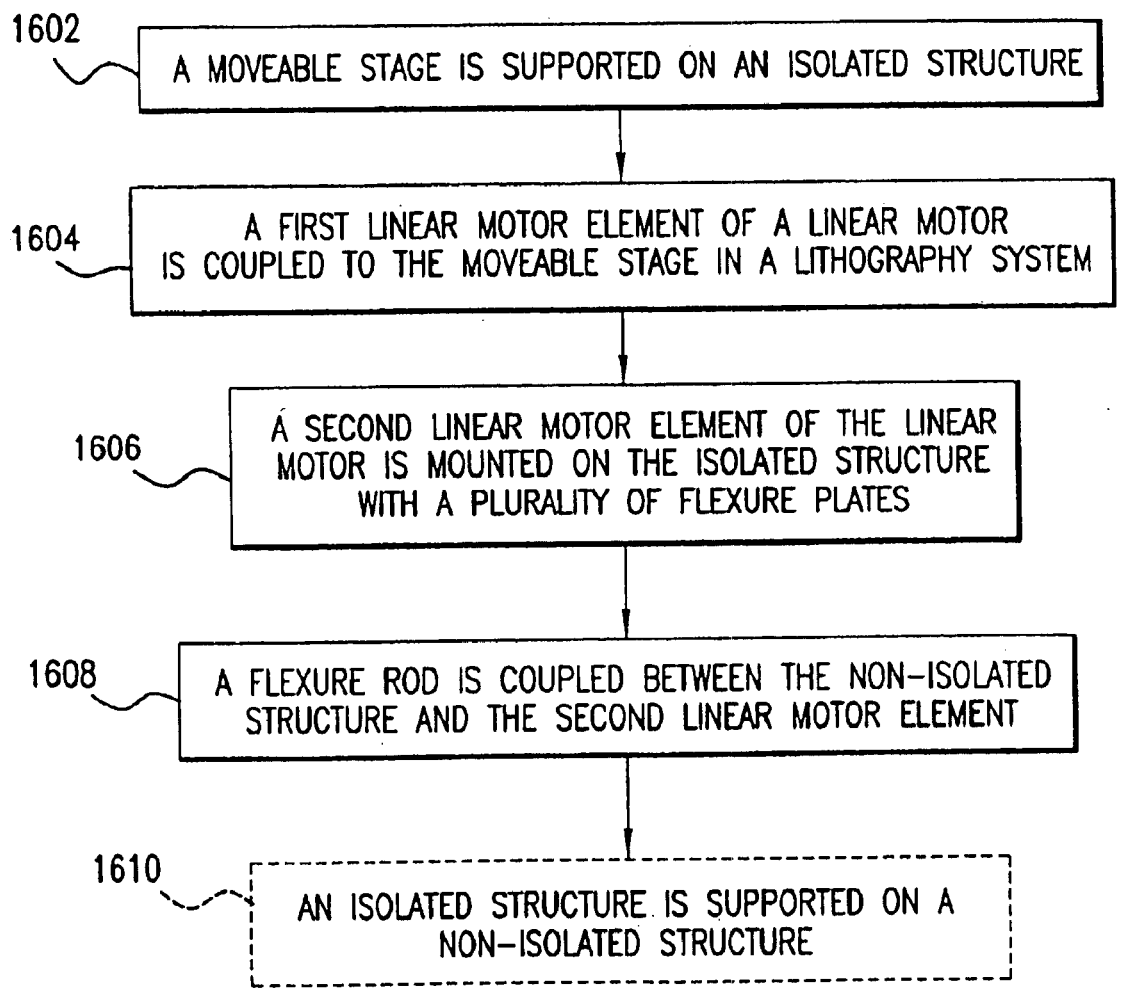

FIG. 16B provides an additional optional step for flowchart 1600 of FIG. 16A. In step 1610, an isolated structure is supported on a non-isolated structure. For example, as shown in FIG. 1, isolated structure 104 is supported on non-isolated structure 102. For example, step 1610 may include the step where the isolated structure is supported on the non-isolated structure with at least one pneumatic mount. For example, in an embodiment, the at least one pneumatic mount may be included in one or more of supporting/positioning elements 116 shown in FIG. 1. Pneumatic mounts/isolators are further described below in section 4.3.

Figure 16C:
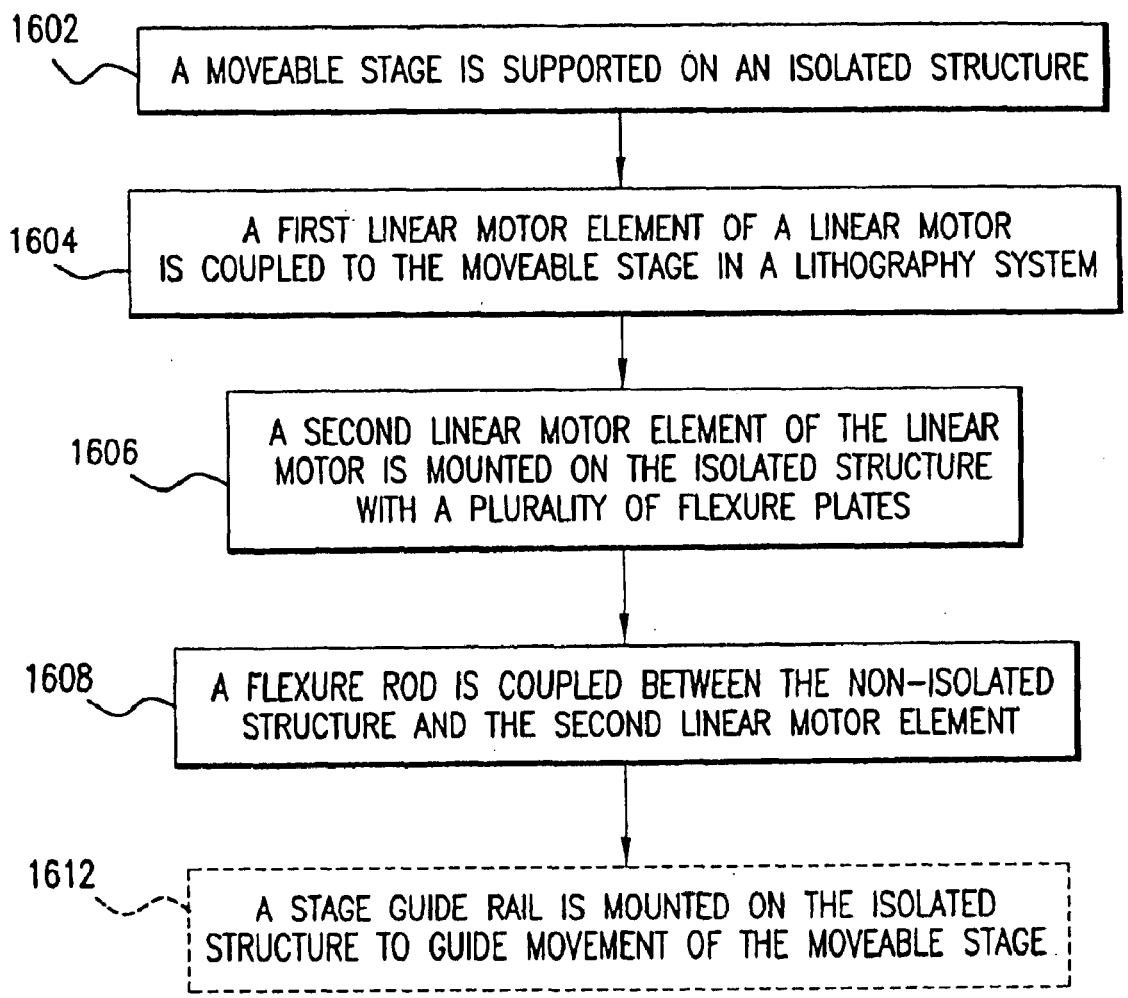

FIG. 16C provides an additional optional step for flowchart 1600 of FIG. 16A. In step 1612, a stage guide rail is mounted on the isolated structure to guide movement of the moveable stage. For example, the stage guide rail may be stage guide rail 106 mounted on isolated structure 104, as shown in FIG. 1.

Figure 16D:
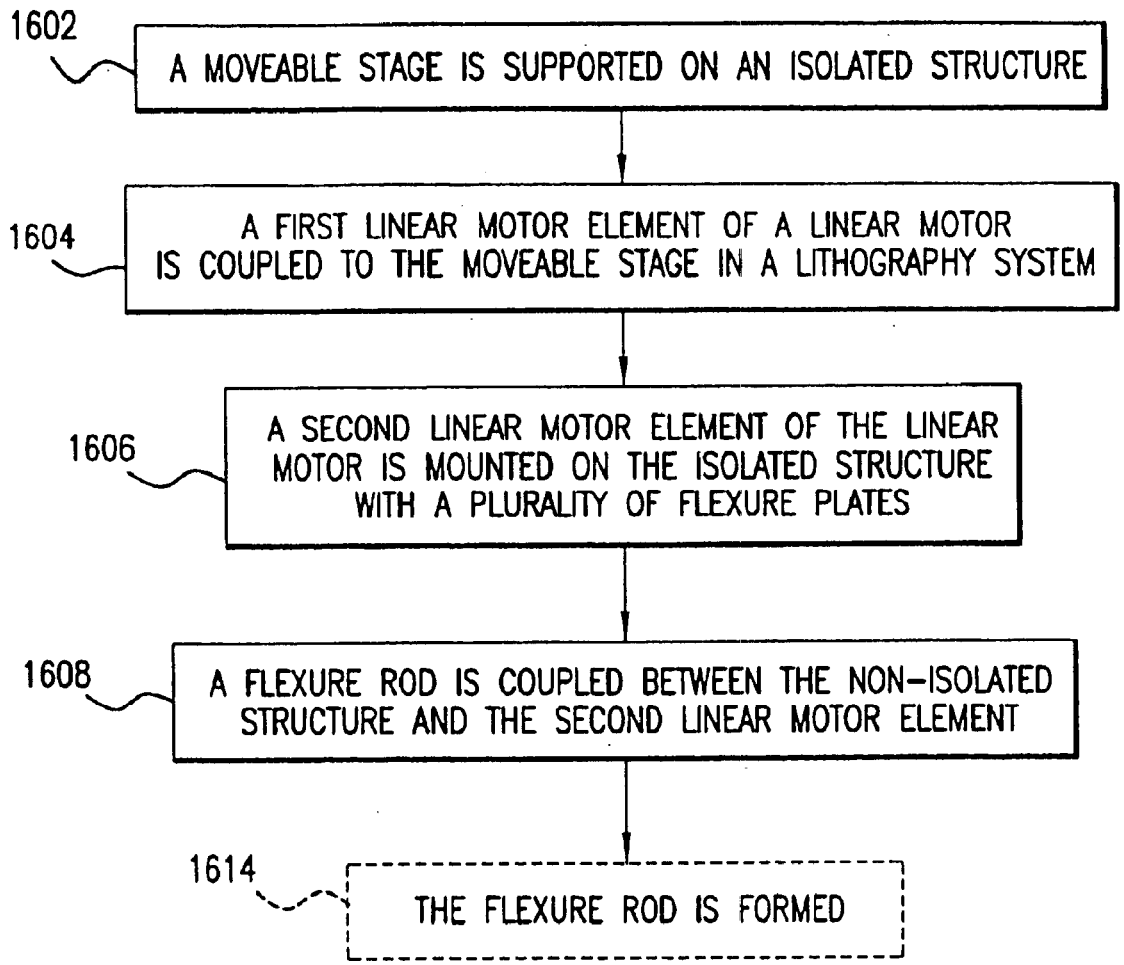

FIG. 16D provides an additional optional step for flowchart 1600 of FIG. 16A. In step 1614, the flexure rod is formed. As described above, flexure rod 114 may be formed in a variety of ways, and from a variety of materials. For example, as described above, flexure rod 114 may be formed from metal, plastic, ceramic, or glass, or a combination thereof. Flexure rod 114 may be formed by a molding, milling, or other manufacturing process.

In an embodiment, step 1614 includes the step where the flexure rod is formed to include at least a cruciform-shaped flexure rod portion. Flexure rod 114 may include one or more of first and second double-cut flexure portions 602 and 606, cruciform flexure portion 604, and may be formed to include additional and alternative features.

Step 1614 may include the step where the cruciform-shaped flexure rod portion is coupled in between a first double-cut flexure rod portion and a second double-cut flexure rod portion. For example, in an embodiment, cruciform flexure portion 604 may be positioned in flexure rod 114 between first and second double-cut flexure portions 602 and 606. These elements may also be positioned in any other order.

Step 1614 may include the step where the flexure rod is formed from at least one of a rotary bearing, a spherical joint, and a universal joint.

Figure 16E:
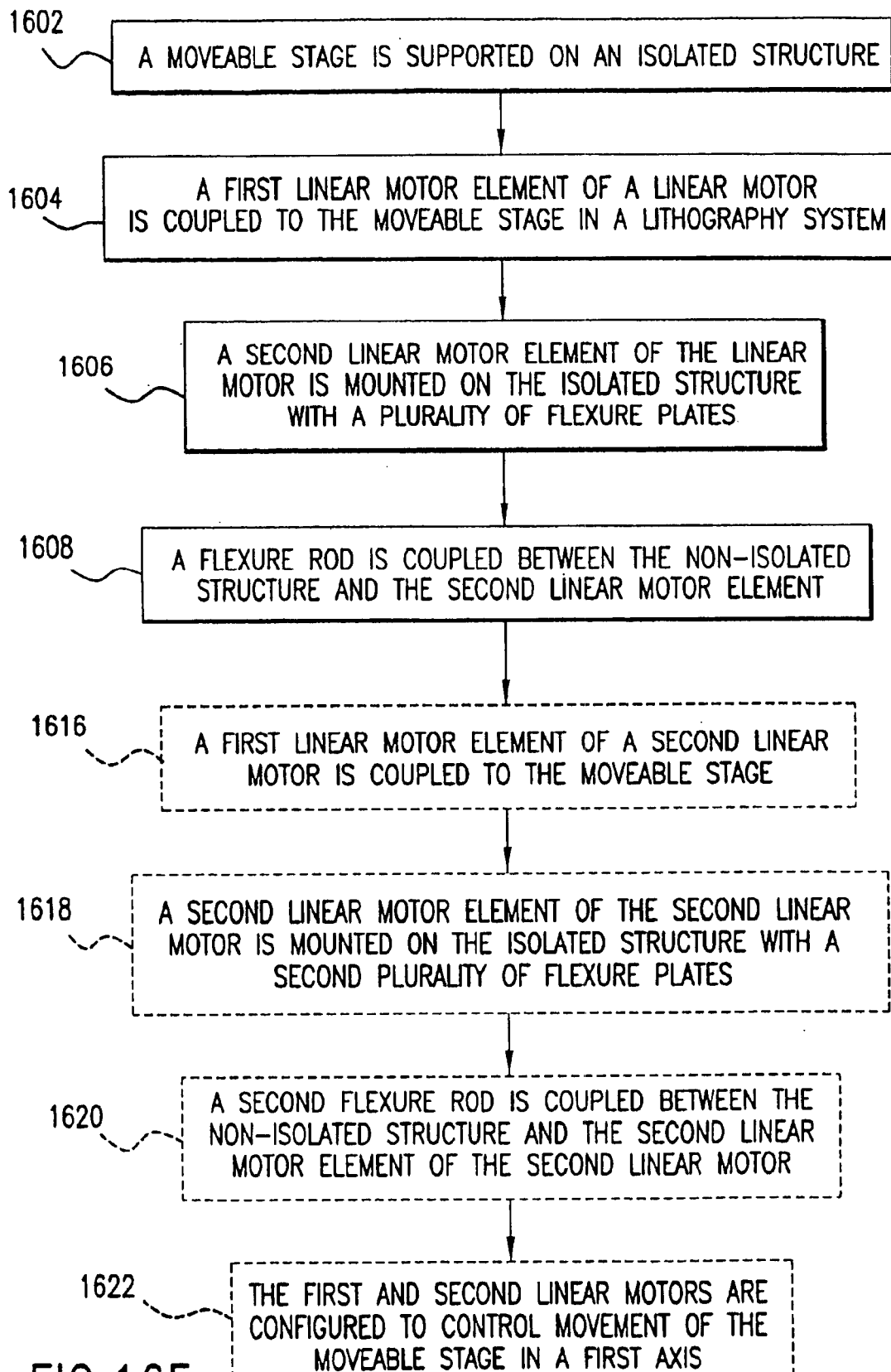

FIG. 16E provides additional optional steps for flowchart 1600 of FIG. 16A:

In step 1616, a first linear motor element of a second linear motor is coupled to the moveable stage. For example, the first linear motor element may be first linear motor element 118b of second linear motor 10b, as shown in FIG. 2. First linear motor element 118b is coupled to moveable stage first axis portion 202.

In step 1618, a second linear motor element of the second linear motor is mounted on the isolated structure with a second plurality of flexure plates. For example, the second linear motor element of the second linear motor may be second linear motor element 122b of second linear motor 110b. As shown in FIG. 2, second linear motor element 122b is mounted on isolated structure 104 by a second plurality of flexure plates, which include first, second, and third flexure plates 208, 210, and 212 of second parallel flexure mechanism 1112b.

In step 1620, a second flexure rod is coupled between the non-isolated structure and the second linear motor element of the second linear motor. For example, the second flexure rod may be second flexure rod 114b, shown in FIG. 2. Second flexure rod 114b is coupled between non-isolated structure 102 and second linear motor element 122b.

In step 1622, the first and second linear motors are configured to control movement of the moveable stage in a first axis. For example, first and second linear motors 110a and 110b shown in FIG. 2 may be configured to control the movement of moveable stage first axis portion 202 along a first axis. For example, first and second linear motors 110a and 110b may receive control signals from a computer or other controller device to control movement of moveable stage first axis portion 202. In an embodiment, each of first and second linear motors 110a and 110b is independently driven by a control algorithm that accounts for the position of the second linear axis (i.e., moveable stage second axis portion 204) of the two-axis stage, so that motion-related loads produced by the first axis (i.e., moveable stage first axis portion 202) can be transferred to non-isolated structure 102.

Figure 16F:
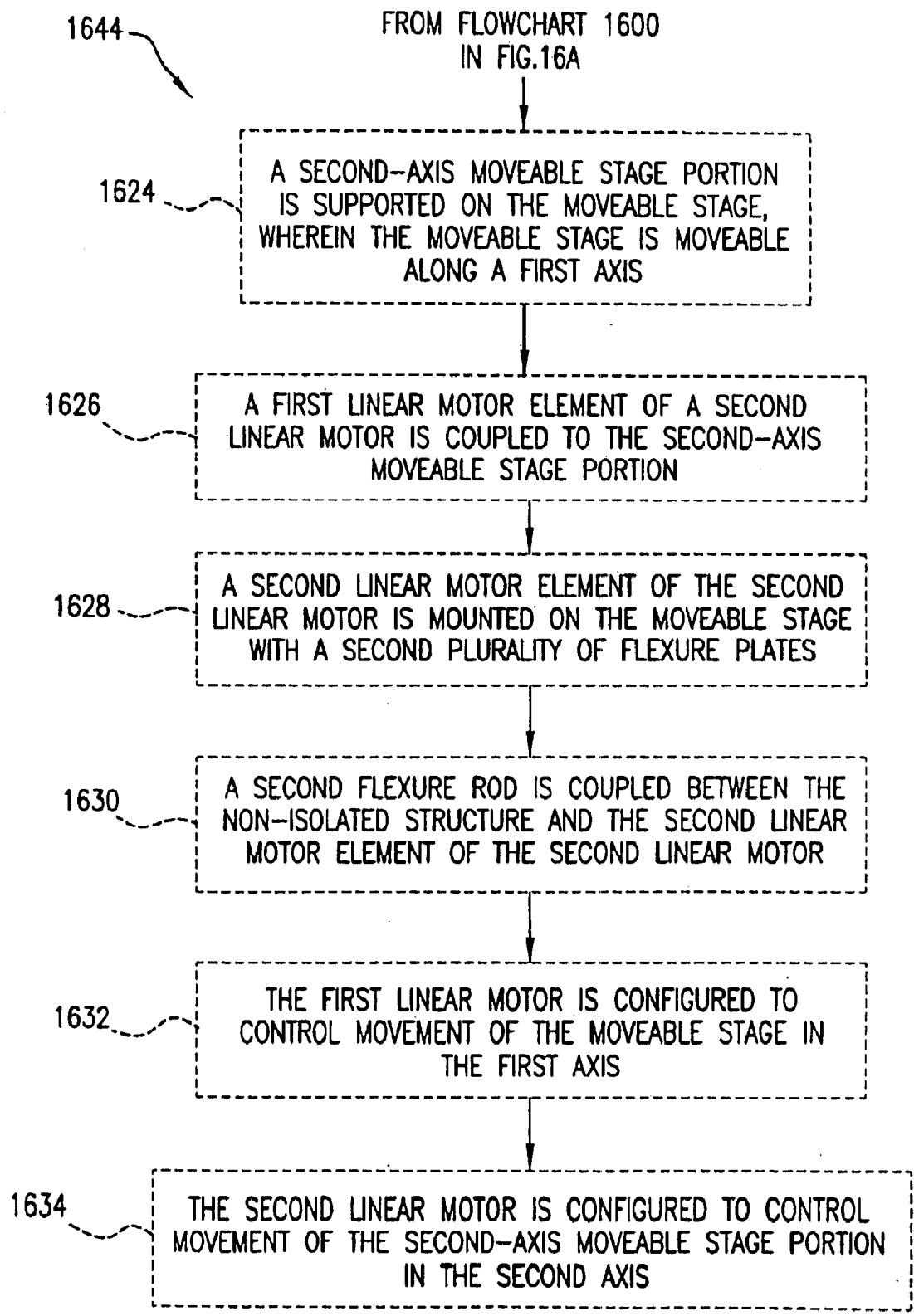

FIG. 16F provides a flowchart 1644 illustrating additional optional steps for flowchart 1600 of FIG. 16A:

In step 1624, a second-axis moveable stage portion is supported on the moveable stage, wherein the moveable stage is moveable along a first axis. For example, the second-axis moveable stage portion is moveable stage second axis portion 204, which is supported on moveable stage first axis portion 202, as shown in FIG. 4.

In step 1626, a first linear motor element of a second linear motor is coupled to the second-axis moveable stage portion. For example, the first linear motor element is second axis first linear motor element 118c of second axis linear motor 110c. Second axis first linear motor element 118c is coupled to moveable stage second axis portion 204.

In step 1628, a second linear motor element of the second linear motor is mounted on the moveable stage with a second plurality of flexure plates. For example, the second linear motor element of the second linear motor is second axis second linear motor element 122c of second axis linear motor 110c. Second axis second linear motor element 122c is mounted on moveable stage first axis portion 202 by second axis parallel flexure mechanism 112c, which includes first, second, and third parallel flexure plates 402, 404, and 406, as shown in FIG. 4.

In step 1630, a second flexure rod is coupled between the non-isolated structure and the second linear motor element of the second linear motor. For example, the second flexure rod is second axis flexure rod 114c. As shown in FIG. 4, second axis flexure rod 114c is coupled between non-isolated structure 102 and second axis second linear motor element 122c.

In step 1632, the first linear motor is configured to control movement of the moveable stage in the first axis. For example, in an embodiment, only a single linear motor, first linear motor 110a is present to control movement of moveable stage first axis portion 202. First linear motor 110a may receive control signals from a computer or other controller device to control movement of moveable stage first axis portion 202. In an embodiment, second linear motor 110b is also present to control movement of moveable stage first axis portion 202. Each of first and second linear motors 110a and 10b may be independently driven by a control algorithm that accounts for the position of the second linear axis (i.e., moveable stage second axis portion 204) of the two-axis stage, so that motion-related loads produced by the first axis (i.e., moveable stage first axis portion 202) can be transferred to non-isolated structure 102.

In step 1634, the second linear motor is configured to control movement of the second-axis moveable stage portion in the second axis. For example, second axis linear motor 110c may be configured to control movement of moveable stage second axis portion 204. In an embodiment, reaction loads from the second linear axis of a two-axis stage system (i.e., moveable stage second axis portion 204 of moveable stage 108 as shown in FIG. 4) can be compensated for passively with the addition of a non-isolated tracking stage, such as tracking stage 408. Tracking stage 408 tracks the position of moveable stage second axis portion 204, and provides received tracking information to one or more linear motor controller(s) for one or more of linear motors 110a, 110b, and 110c.

In an embodiment, a stage guide rail may be mounted on the first moveable stage portion to guide movement of the second moveable stage portion in the second axis. In an embodiment, moveable stage first axis portion 202 may be configured to move along an axis that is substantially perpendicular to the axis, along which moveable stage second axis portion 204 can move, such as is shown in FIG. 4.

Note that in embodiments, two linear motors may be used to control movement of moveable stage second axis portion 204 relative to moveable stage first axis portion 202. FIG. 16G illustrates additional optional steps for flowchart 1644 (shown in FIG. 16F), related to this type of configuration:

In step 1636, a first linear motor element of a third linear motor is coupled to the second-axis moveable stage portion. For example, the third linear motor (not shown in FIG. 4) may be placed in parallel to second axis linear motor 110c to jointly control movement of moveable stage second axis portion 204.

In step 1638, a second linear motor element of the third linear motor is mounted on the moveable stage with a third plurality of flexure plates. For example, the second linear motor element of the third linear motor may be mounted on moveable stage first axis portion 202 by a plurality of parallel flexure plates (not shown in FIG. 4).

In step 1640, a third flexure rod is coupled between the non-isolated structure and the second linear motor element of the third linear motor. For example, the third flexure rod may be coupled between non-isolated structure 102 and the second linear motor element of the third linear motor (not shown in FIG. 4).

In step 1642, the second and third linear motors are configured to control movement of the second-axis moveable stage portion in the second axis. For example, second axis linear motor 110c and the third linear motor (not shown in FIG. 4) may be configured to control movement of the moveable stage second axis portion 204, in a similar manner in which first and second linear motors 110a and 110b control movement of moveable stage first axis portion 202, as described in regards to FIGS. 2 and 4.

4. Supporting/Positioning Elements for an Isolated Structure

The following subsections describe devices and methods for supporting isolated structure 104 on non-isolated structure 102. These devices and methods are provided herein for illustrative purposes. The present invention is applicable to alternative types of supporting and positioning elements for isolated structure 104, as would be known by persons skilled in the relevant art(s).

4.1 Non-contact Magnetic Force Actuators

Figure 3A:
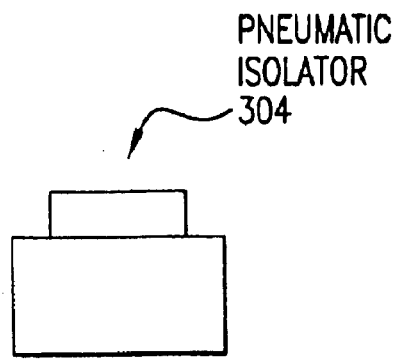
FIG. 3A illustrates an exemplary pneumatic isolator.

Non-contact magnetic force actuators are useful for high performance isolation systems, and are particularly useful in magnetically levitated stages. Magnetic force actuators are typically "Lorentz force" devices. An example Lorentz actuator 302 is shown in FIG. 3C. FIG. 3C shows a side view of Lorentz actuator 302 on the left, and a front view on the right. Lorentz actuator 302 includes a permanent magnet assembly 308 and a drive coil 310. Magnet assembly 308 generates a strong magnetic field that loops though the independently mounted drive coil 310. When a control current is passed though drive coil 310, the interaction between the current and the magnetic field generates a "Lorentz force" on drive coil 310 at right angles to the current flow and magnetic field lines. The force in drive coil 310 is proportional to the current, and an equal but opposite reaction force appears on permanent magnet assembly 308. If permanent magnet assembly 308 generates a uniform magnetic field over the volume of drive coil 310, then the force produced by Lorentz actuator 302 is independent of the position of drive coil 310 within magnetic assembly 308.

When used in an active positioning servo, Lorentz force actuators allow the position of a structure to be actively controlled without coupling vibration to the controlled structure. Alternative types of magnetic actuators, such as electromagnets, can be used in place of Lorentz actuators. Because the force produced by electromagnets is typically highly gap dependent, compensating for this non-linearity can add complexity to a control servo.

In a typical configuration, six actuators can be used to position a structure such as isolated structure 104, with three actuators arranged in a vertical orientation, two arranged in a first horizontal orientation and one arranged in a second horizontal orientation. This configuration and alternative configurations are applicable to the present invention. Actuator arrangements where one actuator force is nearly in-line with another is generally undesirable.

4.2 Non-contact Relative Position Sensors

A number of different technologies have been used to measure the absolute displacement between two objects without physical contact. For instance, an interferometer may be used. A combination of infrared light emitting diodes and photo-diodes can be used to detect motions. For example, such a combination can be used to detect motions on the order of +/−1 mm. If the photodetector is a quad cell or a two-dimensional photo pot, a single sensor can measure two axes at once.

Figure 3B:
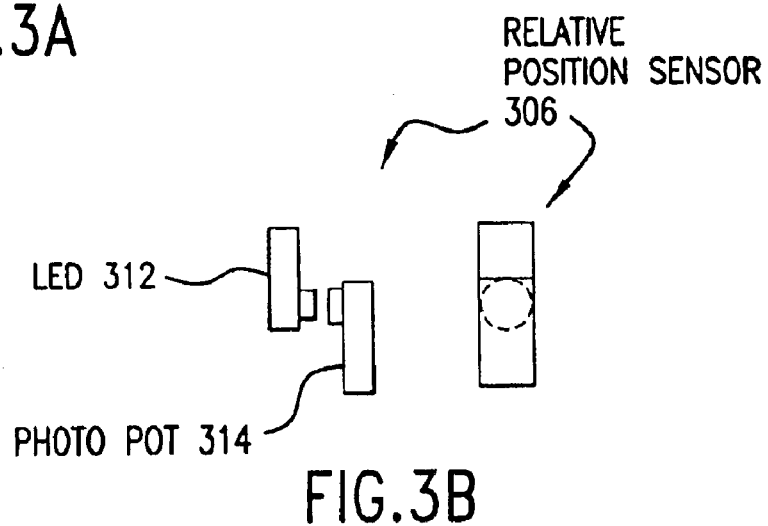
FIG. 3B illustrates two views of an exemplary relative position sensor.
Figure 3C:
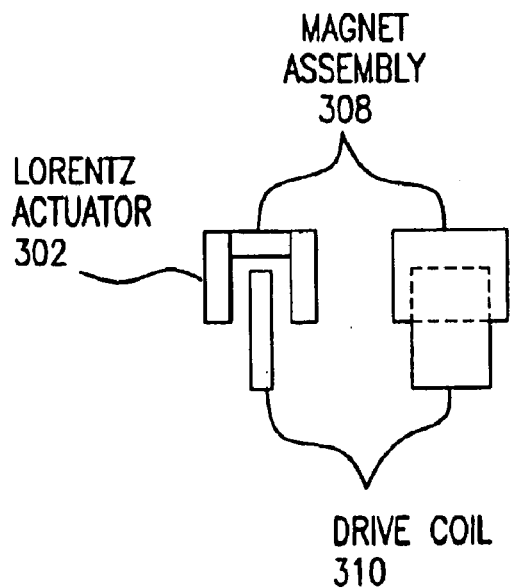
FIG. 3C illustrates two views of an exemplary Lorentz actuator.

FIG. 3B shows two views of a relative position sensor 306, that includes a light emitting diode (LED) 312 and a photo potentiometer 314. Capacitance and eddy current gages can also be used, as well as linear variable differential transformers (LVDTs). For longer distances, optical encoders, either absolute or incremental, can be used. For high accuracy measurement over extended ranges, laser gage interferometers can be used.

In a typical configuration, three dual-axis sensors are located in a pattern that permits accurate measure of the three translation degrees of freedom, and the rotational degrees of freedom. This configuration and alternative configurations are applicable to the present invention. Sensor arrangements where one linear measurement is nearly in-line with another are generally undesirable.

4.3 Pneumatic Isolators, and Counter Force Devices

A variety of devices are available for supporting and isolating structures such as isolated structure 104. For example, rolling diaphragm pneumatic isolators can be used to counter-force the weight of stationary isolated structures.

As discussed above, FIG. 3A shows an exemplary pneumatic isolator 304. Damped pendulum supports can be used to provide horizontal isolation. Rubber bearings can also be used as a counter force device. In a typical configuration, three or four isolators can be placed around the center of gravity of the supported structure. This configuration and alternative configurations are applicable to the present invention.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for management of reaction loads in a lithography system that includes a linear motor and an isolated structure, wherein the isolated structure is supported by a non-isolated structure, wherein the isolated structure supports a moveable stage, wherein the linear motor includes a first linear motor element and a second linear motor element, wherein the first linear motor element is coupled to the moveable stage, the method comprising:

operating the linear motor to move the moveable stage in a linear direction on the isolated structure;

causing a reaction load due to said operating of the linear motor to move the moveable stage, wherein the reaction load is along an axis parallel to the linear direction;

allowing a mount of the second linear motor element to flex in a direction along the axis to decouple the reaction load from the isolated structure; and transferring the reaction load to the non-isolated structure.

2. The method of claim 1, wherein a flexure rod is coupled between the second linear element and the non-isolated structure, wherein said transferring step comprises:

transferring the reaction load to the non-isolated structure through the flexure rod.

3. The method of claim 2, further comprising the step of:

allowing the flexure rod to flex in five degrees of freedom, wherein the flexure rod is rigid in a sixth degree of freedom corresponding to the axis parallel to the linear direction.

4. The method of claim 1, wherein the mount of the second linear motor element comprises at least one flexure plate, wherein said allowing step comprises:

allowing the at least one flexure plate to flex in a direction along the axis to decouple the reaction load from the isolated structure.

5. The method of claim 1, wherein the mount of the second linear motor element comprises a plurality of flexure plates, wherein said allowing step comprises:

allowing the plurality of flexure plates to flex in a direction along the axis to decouple the reaction load from the isolated structure.

6. The method of claim 1, wherein the moveable stage is a wafer stage, wherein said operating step comprises:

operating the linear motor to move the wafer stage in the linear direction on the isolated structure.

7. The method of claim 1, wherein the moveable stage is a reticle stage, wherein said operating step comprises:

operating the linear motor to move the reticle stage in the linear direction on the isolated structure.

8. The method of claim 1, wherein the moveable stage is a stage that mounts a framing blade, wherein said operating step comprises:
   operating the linear motor to move the stage that mounts the framing blade in the linear direction on the isolated structure.

9. A method for management of reaction loads in a lithography system that includes a multi-axis moveable stage supported on an isolated structure, wherein the isolated structure is supported by a non-isolated structure, wherein each axis of the multi-axis moveable stage includes a linear motor that has a corresponding first linear motor element and a corresponding second linear motor element, wherein the first linear motor element of the linear motor of each axis of the multi-axis moveable stage is coupled to the moveable stage, the method comprising:
   for at least one axis of the multi-axis moveable stage, performing the steps of:
   (a) operating the corresponding linear motor to move the moveable stage in a corresponding linear direction on the isolated structure;
   (b) causing a corresponding reaction load due to said operating of the corresponding linear motor to move the moveable stage, wherein the
   (e) allowing the corresponding flexure rod to flex in five degrees of freedom, wherein the corresponding flexure rod is rigid in a sixth degree of freedom corresponding to the axis parallel to the corresponding linear direction.

10. The method of claim 9, wherein for each axis of the multi-axis moveable stage, a corresponding flexure rod is coupled between the corresponding second linear motor element and the non-isolated structure, wherein said transferring step comprises:
   transferring the corresponding reaction load to the non-isolated structure through the corresponding flexure rod.

11. The method of claim 10, wherein for at least one axis of the multi-axis moveable stage, further performing the step of:
   motor moves the moveable stage, wherein said reaction load is along an axis parallel to said corresponding linear direction;
   mounting means for said second linear motor element that flexes in a direction along said axis to decouple said reaction load from the isolated structure; and
   means for transferring said reaction load to the non-isolated structure.

12. The method of claim 9, wherein the mount of each second linear motor element comprises a corresponding at least one flexure plate, wherein said allowing step comprises:
   allowing the corresponding at least one flexure plate to flex in a direction along the axis parallel to the corresponding linear direction.

13. The method of claim 9, wherein the mount of each second linear motor element comprises a corresponding plurality of flexure plates, wherein said allowing step comprises:
   allowing the corresponding plurality of flexure plates to flex in a direction along the axis parallel to the corresponding linear direction.

14. The method of claim 9, wherein the moveable stage is a wafer stage, wherein said operating step comprises:
   operating the corresponding linear motor to move the wafer stage in the corresponding linear direction on the isolated structure.

15. The method of claim 9, wherein the moveable stage is a reticle stage, wherein said operating step comprises:
   operating the corresponding linear motor to move the reticle stage in the corresponding linear direction on the isolated structure.

16. The method of claim 9, wherein the moveable stage is a stage that mounts a framing blade, wherein said operating step comprises:
   operating the corresponding linear motor to move the stage that mounts the framing blade in the corresponding linear direction on the isolated structure.

17. A system for management of reaction loads in a lithography system that includes an isolated structure supported by a non-isolated structure, wherein the isolated structure supports a moveable stage, the system comprising:
   a linear motor that moves the moveable stage in a linear direction on the isolated structure, wherein said linear motor includes a first linear motor element and a second linear motor element, wherein a reaction load is caused when said linear motor moves the moveable stage, wherein said reaction load is along an axis parallel to said linear direction;
   mounting means for said second linear motor element that is flexes in a direction along said axis to decouple said reaction load from the isolated structure; and
   means for transferring said reaction load to the non-isolated structure.

18. A system for management of reaction loads in a lithography system that includes an isolated structure supported by a non-isolated structure, wherein the isolated structure supports a multi-axis moveable stage, the system comprising for each axis:
   a linear motor that moves the moveable stage in a corresponding linear direction on the isolated structure, wherein said linear motor includes a first linear motor element and a second linear motor element, wherein a reaction load is caused when said linear corresponding reaction load is along an axis parallel to the corresponding linear direction;
   (c) allowing a corresponding mount of the corresponding second linear motor element to flex along the axis parallel to the corresponding linear direction to decouple the corresponding reaction load from the isolated structure; and
   (d) transferring the corresponding reaction load to the non-isolated structure.

* * * * *

UNITED STATES PATENT AND TRADEMARK OFFICE
CERTIFICATE OF CORRECTION

PATENT NO. : 6,885,435 B2
DATED : April 26, 2005
INVENTOR(S) : Daniel N. Galburt It is certified that error appears in the above-identified patent and that said Letters Patent is hereby corrected as shown below:

Column 20,
Lines 34-35, "that is flexes" should appear as -- that flexes --.

Signed and Sealed this

Eighteenth Day of October, 2005

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,885,435 B2 | |
| DATED | : April 26, 2005 | |
| INVENTOR(S) | : Daniel N. Galburt | |

It is certified that error appears in the above-identified patent and that said Letters Patent is hereby corrected as shown below:

Column 19,
Lines 25-30, "the moveable stage, wherein the
(e) allowing the corresponding flexure rod to flex in five degrees of freedom, wherein the corresponding flexure rod is rigid in a sixth degree of freedom corresponding to the axis parallel to the corresponding linear direction"
should appear as follows:
-- the moveable stage, wherein the corresponding reaction load is along an axis parallel to the corresponding linear direction"
should appear as follows:
-- the moveable stage, wherein the corresponding reaction load is along an axis parallel to the corresponding linear direction;
(c) allowing a corresponding mount of the corresponding second linear motor element to flex along the axis parallel to the corresponding linear direction to decouple the corresponding reaction load from the isolated structure; and
(d) transferring the corresponding reaction load to the non-isolated structure. --.
Lines 43-50, "motor moves the moveable stage, wherein said reaction load is along an axis parallel to said corresponding linear direction;
mounting means for said second linear motor element that flexes in a direction along said axis to decouple said reaction load from the isolated structure; and
means for transferring said reaction load to the non-isolated structure."
should appear as follows:
-- (e) allowing the corresponding flexure rod to flex in five degrees of freedom, wherein the corresponding flexure rod is rigid in a sixth degree of freedom corresponding to the axis parallel to the corresponding linear direction. --.

Column 20,
Lines 41-54, "a linear motor that moves the moveable stage in a corresponding linear direction on the isolated structure wherein said linear motor includes a first linear motor element and a second linear motor element, wherein a reaction load is caused when said linear corresponding reaction load is along an axis parallel to the corresponding linear direction;
(c) allowing a corresponding mount of the corresponding second linear motor element to flex along the axis parallel to the corresponding linear direction to decouple the corresponding reaction load from the isolated structure; and
(d) transferring the corresponding reaction load to the non-isolated structure."
should appear as follows:

UNITED STATES PATENT AND TRADEMARK OFFICE
CERTIFICATE OF CORRECTION

PATENT NO.   : 6,885,435 B2
DATED        : April 26, 2005
INVENTOR(S)  : Daniel N. Galburt It is certified that error appears in the above-identified patent and that said Letters Patent is hereby corrected as shown below:

Column 20 (cont'd),
-- a linear motor that moves the moveable stage in a corresponding linear direction on the isolated structure, wherein said linear motor includes a first linear motor element and a second linear motor element, wherein a reaction load is caused when said linear motor moves the moveable stage, wherein said reaction load is along an axis parallel to said corresponding linear direction; mounting means for said second linear motor element that flexes in a direction along said axis to decouple said reaction load from the isolated structure; and
means for transferring said reaction load to the non-isolated structure. --.

Signed and Sealed this

Third Day of January, 2006

JON W. DUDAS
*Director of the United States Patent and Trademark Office*